US008853804B2

(12) United States Patent
Krylov et al.

(10) Patent No.: US 8,853,804 B2
(45) Date of Patent: *Oct. 7, 2014

(54) TILTING ACTUATOR WITH CLOSE-GAP ELECTRODES

(71) Applicant: Ramot at Tel-Aviv University Ltd., Tel Aviv (IL)

(72) Inventors: Viacheslav Krylov, Holon (IL); Tsvi Shmilovich, Tel Aviv (IL)

(73) Assignee: Ramot at Tel-Aviv University Ltd., Tel Aviv (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/754,537

(22) Filed: Jan. 30, 2013

(65) Prior Publication Data

US 2013/0141768 A1 Jun. 6, 2013

Related U.S. Application Data

(63) Continuation of application No. 12/484,338, filed on Jun. 15, 2009, now Pat. No. 8,378,434, which is a continuation of application No. PCT/IL2007/001554, filed on Dec. 16, 2007.

(60) Provisional application No. 60/874,675, filed on Dec. 14, 2006.

(51) Int. Cl.
| B81B 5/00 | (2006.01) |
| B81B 7/02 | (2006.01) |
| H02N 1/00 | (2006.01) |
| G02B 26/08 | (2006.01) |
| B81B 3/00 | (2006.01) |

(52) U.S. Cl.
CPC ............ *G02B 26/0841* (2013.01); *H02N 1/008* (2013.01); *H02N 1/006* (2013.01); *B81B 3/0018* (2013.01); *B81B 3/0021* (2013.01)
USPC ...................... 257/415; 359/199.2; 359/200.6; 359/212.1; 359/212.2; 359/223.1; 359/226.1; 310/309

(58) Field of Classification Search
CPC .... B81B 3/0018; B81B 3/0021; H01N 1/006; H01N 1/008; G02B 26/0841
USPC ............. 257/415; 310/309; 359/199.2, 200.6, 359/212.1, 212.2, 223.1, 226.1
See application file for complete search history.

(56) References Cited

U.S. PATENT DOCUMENTS 5,381,288 A * 1/1995 Karam, II ................... 360/245
5,969,848 A 10/1999 Lee et al.
(Continued)

OTHER PUBLICATIONS

Acar, Cenk et al., "Structural design and experimental characterization of torsional micromachined gyroscopes with non-resonant drive mode", Journal of Micromechanics and Microengineering, vol. 14, pp. 15-25, 2004.

(Continued)

*Primary Examiner* — Mary Wilczewski
(74) *Attorney, Agent, or Firm* — Browdy and Neimark, PLLC

(57) ABSTRACT

A tunable tilting device is described. The device includes a tilting element and a suspension structure that has one or more flexures coupled to the tilting element. The suspension structure has a variable bending stiffness and configured to bend due to a tilting motion of the tilting element around a pivot axis. The suspension structure is responsive to a tuning force actuating a variation of an extension stress or a compression stress of the suspension structure, and thereby can vary the bending stiffness of the suspension structure.

13 Claims, 17 Drawing Sheets

(56) References Cited

U.S. PATENT DOCUMENTS

| | | | |
|---|---|---|---|
| 6,000,280 | A | 12/1999 | Miller et al. |
| 6,067,858 | A | 5/2000 | Clark et al. |
| 6,296,779 | B1 | 10/2001 | Clark et al. |
| 6,333,584 | B1 | 12/2001 | Jerman |
| 6,600,591 | B2 | 7/2003 | Anderson et al. |
| 6,628,856 | B1 | 9/2003 | Costello et al. |
| 6,735,004 | B1 | 5/2004 | Hagelin et al. |
| 6,794,217 | B2 * | 9/2004 | Lee et al. .......... 438/72 |
| 6,827,866 | B1 | 12/2004 | Novotny |
| 6,905,614 | B1 | 6/2005 | Novotny |
| 6,914,710 | B1 | 7/2005 | Novotny |
| 6,956,683 | B2 * | 10/2005 | Heaton et al. ........ 359/200.6 |
| 7,085,122 | B2 | 8/2006 | Wu et al. |
| 7,196,599 | B2 | 3/2007 | Dabbaj |
| 7,205,174 | B2 * | 4/2007 | Hung .......... 438/52 |
| 7,224,097 | B2 | 5/2007 | Obi et al. |
| 7,239,774 | B1 | 7/2007 | Stowe et al. |
| 7,466,474 | B2 | 12/2008 | Jung et al. |
| 7,529,444 | B2 | 5/2009 | Stowe et al. |
| 7,782,594 | B2 | 8/2010 | Rottenberg |
| 8,035,874 | B1 | 10/2011 | Fu |
| 8,049,944 | B2 | 11/2011 | Moidu Abdul |
| 8,378,434 | B2 * | 2/2013 | Krylov et al. .......... 257/415 |
| 8,643,937 | B2 * | 2/2014 | Haspeslagh et al. ........ 359/292 |
| 8,717,638 | B2 * | 5/2014 | Mizoguchi .......... 358/475 |
| 2001/0044165 | A1 * | 11/2001 | Lee et al. .......... 438/52 |
| 2002/0135850 | A1 | 9/2002 | Hagelin et al. |
| 2003/0123124 | A1 | 7/2003 | Abu-Ageel |
| 2003/0203530 | A1 * | 10/2003 | Lee et al. .......... 438/72 |
| 2004/0032634 | A1 | 2/2004 | Hah et al. |
| 2004/0184132 | A1 | 9/2004 | Novotny et al. |
| 2004/0252356 | A1 * | 12/2004 | Heaton et al. .......... 359/198 |
| 2006/0203319 | A1 | 9/2006 | Kouma et al. |
| 2008/0239446 | A1 | 10/2008 | Jung et al. |
| 2010/0006958 | A1 | 1/2010 | Krylov |
| 2011/0188104 | A1 | 8/2011 | Tachibana et al. |

OTHER PUBLICATIONS

Ataman, Caglar et al., "Nonlinear Frequency Response of Comb-Driven Microscanners", MOEMS Display and Imaging Systems II, Proc. SPIE vol. 5348, pp. 166-174, 2004.

Chiou, J.C. et al., "A novel large displacement electrostatic actuator: pre-stress comb-drive actuator", Journal of Micromechanics and Microengineering, vol. 15, pp. 1641-1648, 2005.

Lee, Chengkuo, "Design and fabrication of epitaxial silicon micromirror devices", Sensors and Actuators A, vol. 115, pp. 581-590, 2004.

Lee, D. et al., "Single-crystalline silicon micromirrors actuated by self-aligned vertical electrostatic combdrives with piston-motion and rotation capability", Sensors and Actuators A, vol. 114, pp. 423-428, 2004.

Isamoto, Keiji et al., "A 5-V Operated MEMS Variable Optical Attenuator by SOI Bulk Micromachining", IEEE Journal of Selected Topics in Quantum Electronics, vol. 10, No. 3, pp. 570-578, 2004.

Lee, Ki Bang, "Non-contact electrostatic microactuator using slit structures: theory and a preliminary test", Journal of Micromechanics and Microengineering, vol. 17, pp. 2186-2196, 2007.

Kim, Jongbaeg et al., "Monolithic 2-D Scanning Mirror Using Self-Aligned Angular Vertical Comb Drives", IEEE Photonics Technology Letters, vol. 17, No. 11, pp. 2307-2309, 2005.

Kouma, Norinao et al., "Fishbone-Shaped Vertical Comb Actuator for Dual-Axis 1-D Analog Micromirror Array", in the IEEE Proceedings of the 13th International Conference on Solid-State Sensors, Actuators, and Microsystems, pp. 980-983, 2005.

Krylov, Slava et al., "Bouncing mode electrostatically actuated scanning micromirror for video applications", Smart Materials and Structures, vol. 14, pp. 1281-1296, 2005.

Peterson, Kurt E., "Silicon Torsional Scanning Mirror", IBM Journal of Research Development, vol. 24, No. 5, pp. 631637, 1980.

Schenk, Harald et al., "Large Deflection Micromechanical Scanning Mirrors for Linear Scans and Pattern Generation", IEEE Journal of Selected Topics in Quantum Electronics, vol. 6, No. 5, pp. 715-722, 2000.

* cited by examiner

TILTING ACTUATOR WITH CLOSE-GAP ELECTRODES

FIELD OF THE INVENTION

This invention relates to electromechanical transducing and actuating in general and to tilt MEMS actuating in variants.

REFERENCES

[1] D. Lee, U. Krishnamoorthy, K. Yu, and O. Solgaard, "Single-crystalline silicon micromirrors actuated by self-aligned vertical electrostatic combdrives with piston-motion and rotation capability," Sensors and Actuators A, vol. 114, pp. 423-428, 2004;

[2] K. Isamoto, K. Kato, A. Morosava, C. Chong, H. Fujita and H. Toshiyoshi, "A 5-V operated MEMS variable optical attenuator by SOI bulk micromachining," IEEE J. of Selected Topics in Quantum Electronics, vol. 10, pp. 570-578, 2004;

[3] S. Krylov and D. I. Barnea, "Bouncing mode electrostatically actuated scanning micromirror for video applications", Smart Mater. Struct., vol. 14, pp. 1281-1296, 2005;

[4] K. Petersen, "Silicon torsional scanning mirror", IBM J. Research and Development, vol. 24, pp. 631-637, 1980;

[5] J. Kim, D. Christensen, and L. Lin, "Monolithic 2-D scanning mirror using self-aligned angular vertical comb drives," IEEE Photonics Technology Letters, vol. 17, pp. 2307-2309, 2005;

[6] H. Schenk, P. Dürr, T. Haase, D. Kunze, U. Sobe, H. Lakner, and H. Kück, "Large deflection micromechanical scanning mirrors for linear scans and pattern generation", IEEE J. of Selected Topics in Quantum Electronics, vol. 6, pp. 715-722, 2000;

[7] C. Lee, "Design and fabrication of epitaxial silicon micromirror devices", Sensors and Actuators A, vol. 115, pp. 581-590, 2004;

[8] C. Ataman, H. Urey, "Nonlinear frequency response of comb-driven microscanners", MOEMS Display and Imaging Systems II, SPIE, vol. 5348, pp. 166-174, 2004;

[9] N. Kouma, O. Tsuboi, H. Soneda, S. Ueda, I. Sawaki "Fishbone-shaped Vertical Comb Actuator For Dual-Axis 1-D Analog Micromirror Array" in the IEEE Proceedings of the 13th International Conference on Solid-State Sensors, Actuators, and Microsystems, Seoul, Korea, Jun. 5-9, 2005.

[10] J. C. Chiou, Y. J. Lin "A novel large displacement electrostatic actuator: pre-stress comb drive actuator", J. Micromech. Microeng. vol. 15, pp. 1641-1648, 2005

[11] C. Acar, A. M. Shkel, "Structural design and experimental characterization of torsional micromachined gyroscopes with non-resonant drive mode", J. of Micromech. Microeng., vol. 14, pp. 15-25, 2004

[12] C. Ataman, H. Urey, "Nonlinear frequency response of comb-driven microscanners", MOEMS Display and Imaging Systems II, SPIE, vol. 5348, pp. 166-174, 2004

BACKGROUND

Tilting elements and micromachined structures incorporating tilting elements are used in various devices and microdevices and often are essential parts of them, in particular for tilting actuators and sensors. The tilting actuation is used, for example, for many micromirrors which operate in laser displays ([1]), optical communication applications ([2]), angular rate sensors, and radio-frequency (RF) devices. The tilting actuation is also used in magnetic disk drives. In the field of optical communication, in particular, the mirrors and large arrays of mirrors were used for all-optical cross-connects, add-drop filters, variable optical attenuators, fiber optics switches, and intersatellite communication systems. Tilting micromirrors are used as scanning micromirrors also in such fields as laser printing, pattern generation for photomask writing, barcode reading, microscopy, and in such medical applications as endoscopy and tomography.

Various actuation principles can be utilized for design of tilting actuators ([3]). These principles include thermal actuation, piezoelectric actuation, acoustic actuation, as well as somewhat more widely accepted magnetic and electrostatic actuation. The latter type of actuation is highly efficient in microscale due to favorable scaling laws. Additionally, simulation of the electrostatic actuators is relatively convenient, because of the developed modeling tools.

A large variety of design concepts for electrostatic tilting actuators has been reported. Though early tilting actuators were fabricated of polysilicon using surface micromachining ([4]), the use of single crystal silicon (Si) combined with silicon on insulator (SOI) technology has become increasingly popular due to the excellent mechanical properties of such silicon and the high robustness of such devices ([1], [2], [5]).

Tilting elements of the tilting electrostatic microactuators are typically suspended using compliant torsion axes or bending flexures; and an actuating torque is provided by an electromechanical transducer. Electrostatic actuation is widely realized not only because it generally leads to high efficiency, but also because it often can be realized by established fabrication processes and compatibly with integrated circuits.

Typically in the electrostatic actuators the necessary torque is provided either by close gap mechanism ([1]) or by vertical comb driving mechanism. In the former case the actuation is provided by an electrical force or torque acting to decrease the gap between two, a movable and a fixable, electrodes; and in the latter case the actuation is provided by an electrical force or torque acting to increase the overlap between the two electrodes. The first technique is efficient for a small range of tilting angles, and the second technique can be efficient for a somewhat larger range of tilting angles, but it usually requires rather intricate fabrication processes ([1], [5]). The close gap principle is useful also while the electrodes of the biased pair are kept parallel (in the parallel plate technique).

Examples of comb-based actuator are disclosed in [9] and [10]. More examples of comb-based actuator are disclosed in patent application publications US 2004/0184132 and US 2003/0123124.

In order to achieve large amplitudes under small excitation forces, tilting actuators are often exploited in conditions of resonant amplification. For example, this amplification is used in such devices as gyroscopes, micromirrors, electromechanical filters and mass sensors. The resonant operation of single layer SOI tilting devices was reported in [6] and [7].

To benefit from the resonant amplification, the excitation frequency should match, with high accuracy, the resonant frequency of the device. This accuracy often has to be high especially in those applications where stronger amplification is desired: when high quality factors are used the excitation frequency has to fit into a narrower resonance bandwidth. However, the resonant frequency of actuator is typically uncertain, mainly due to varying environmental conditions (e.g. temperature variations) and relatively low fabrication tolerances of micromachining. While the excitation frequency is determined by an application in which the actuator is used, it is the resonance frequency that has to be tuned to the excitation frequency rather than vice versa. Therefore, ability to adjust the resonance frequency of tilting oscillators is valuable. While in some applications the excitation frequency is predetermined, in many applications the excitation frequency changes during the operation. For this latter type of the applications the tilting resonance frequency should be adjusted dynamically.

It should be noted, however, that the achievement of static response either in single layer architecture or in a different architecture is also of interest. In particular, a tilting device with such capability can be used as a switch, manipulator, or tweezer.

DESCRIPTION

There is a need in the art for tilting actuators, tunable tilting actuators, tunable MEMS suspensions, inertial, mass and rotation sensors (such as angular rate sensors and gyroscopes), methods of fabrication of MEMS devices, etc. The inventors of the present invention describe the architecture, operational principle, design, modeling and experimental results of a novel tilting device which may serve as an actuator or a rotation or torque sensor, as well as they provide a novel method and a device (in particular, suspension) for frequency tuning of MEMS devices, and a novel method of fabrication (in particular, separating) microelectronic and MEMS devices, etc.

Considering the operation of the tilting device provided by the inventors, it is electromechanical in the sense that the tilting can be caused by a change in the device's electrical, in particular electrostatic, energy, and the device will have to respond to this change by changing its mechanical energy. In such a case the device (transducer) is operated as an actuator. The device enables the desired energy conversion when it includes at least two, a first and a second, electrode structures defining at least partially interdigitated electrodes and a suspension defining a tilt-involving motion path for the second structure with respect to the first structure. Herein, the interdigitated electrodes, when biased and used as driving electrodes, form capacitors that store the electrostatic energy. The suspension stores the mechanical energy. The motion path is selected in such a way that it causes changes in overlapping regions and overlapping regions' gaps of the interdigitated electrodes. The device is configured in such a way that an increase in one or more voltage bias applied to interdigitated driving electrodes makes a decrease in a total area of overlapping regions of the driving electrodes electrically energetically favorable.

One idea considered by the inventors and which clarifies the need in the above device is in the following: it is possible to fabricate some of the embodiments of this tilting device by a relatively simple fabrication process requiring no precise alignment between masks. For example, the device may be of an architecture in which the two electrode structures (in particular the interdigitated electrodes) are made from the same single layer or have one or more common layers. The interdigitated electrodes therefore will, in some embodiments, overlap by fabrication. According to the inventors' idea, this overlap can be decreased during the actuator operation. It should be understood, that this is despite that an application of a voltage bias to electrodes would typically act to increase the overlap between the electrodes: a change in the electrostatic energy generally results in a force or a torque acting to increase the overall capacitance of the system, and in the most basic cases a larger overlap means a larger capacitance. For example, the principle of increasing overlap is utilized in the basic vertical comb driven actuator: when a bias voltage is applied, a movable electrode comb, initially displaced from a fixable electrode comb, attracts to this fixable comb and shifts or rotates in such a way that its electrodes move into positions between the electrodes of the fixable comb. As said before, such vertical comb movement tends to increase the overlap between interdigitated electrodes. In the technique of the inventors, however, the tendency of electrodes to increase their overlap upon an application of voltage bias can be overcompensated by the tendency of electrodes to move closer to each other. This latter tendency (to move closer to each other) is exploited for example in the basic close gap actuator. Thus, the device of the inventors is configured, in some embodiments, to overcompensate the "vertical comb" attraction force by the "close gap" attraction force; and in order to make the latter attractive force act to decrease the overlap, a suspension that ensures that these attractions pull the biased (driving) electrodes of the movable electrode structure in different directions is used. Herein, the directions along the suspension-defined motion path are meant.

With regards to the overcompensation of the "vertical comb" attraction force by the "close gap" attraction force, it should be noted, that the competition between these forces does not have to be won by the "close gap" attraction force everywhere within the motion path of the movable electrode structure. In fact, if the "close gap" attraction force is stronger than its competitor only in a portion of the motion path, in particular near a suspension equilibrium point (a mechanical equilibrium point), this portion can serve as an actuation region for the whole motion path. In other words, a "regional" electrostatic actuation can be used for reaching all points of the suspension-defined motion path. This is because the electrostatic actuating force or torque is proportional to the square of the voltage bias: if the actuated element (second electrode structure) needs to reach a certain point, the element can be suitably accelerated in the actuating region and reach the certain point by inertia. While moving by inertia, the actuated element will have to overcome the mechanical resistance of the suspension and the electrical resistance in the region where the "vertical comb" force wins against the actuating "close gap" force (or torque); but it should be understood that the electrical resistance can be turned off or reduced by turning off or reducing the bias voltage when or after the actuated element leaves the actuating region. Hence, the tilting device can provide actuation by relying on energy gain associated with a decrease in an overlapping regions' gap, and this actuation can be provided despite an energy loss associated with a decrease in the total area of overlapping regions, even if the gain is larger than the loss only in a portion of the motion path allowed to the second electrode structure by suspension.

The competition between the two attraction forces (the "vertical comb" and "close gap" forces) can be utilized differently: the device may be built to rely for actuation on a force and/or torque associated with an increase in the overlap between the biased electrodes, while a force and/or torque associated with a decrease in gap between the overlapping regions of the biased electrodes can act against the actuation. To this end, the device can be equipped with a suspension that ties the increase in overlap with the increase in the respective gap for the biased electrodes.

For example, the device may include a first and a second electrode structures defining at least partially interdigitated finger electrodes, and a suspension tying in a certain region of the defined by it motion path an increase in an area of overlapping regions of interdigitated electrodes with an increase in at least one overlapping regions' gap. The structures herein are shaped, positioned and oriented so that in a subportion of this path's portion an application of one or more voltage bias to one or more pair of interdigitated driving electrodes makes a motion leading to an increase in a total area of overlapping regions of the driving electrodes electrically energetically favorable, despite that the motion is accompanied by an increase in at least one gap separating these overlapping regions. Such a subportion of the motion path then defines a region of actuation switchable by voltage bias. Reiterating that written above with respect to other embodiments, even a small region of actuation (i.e. a region wherein an application of voltage bias can cause a force or a torque acting to move an actuated element from a position of mechanical equilibrium) is generally sufficient to allow the actuated element reaching any specific point within the motion path by inertia.

The inventors' idea to use competing electrostatic attraction forces for actuation does not require interdigitated electrodes. For example, the tilting actuator can include just two electrodes, a first of which is fixable and a second of which is held by a suspension allowing moving the second electrode with respect to a first, but limiting this motion to a rotation around a certain axis, and having a single position of mechanical equilibrium within thus defined motion path (such suspension properties can be provided for example by a torsional axis). The usability for the actuation of such a device, as the inventors have found, depends on a position of the rotation axis: for most of the positions, the electrical force (torque) can not be used to assist the movement of the actuated element in at least one of quarter-periods of actuated element oscillations. For example, in some positions of the rotation axis the electrical force always acts in one direction. This in particular is the case with the "close gap" electrodes. In such a case the second electrode, moving back from a pulled-in position to the mechanical equilibrium position, is always delayed by the voltage bias applied to the electrodes, unless the latter voltage is switched off. Therefore, in the present example, only the mechanic force can serve as a restoring force in the quarter-period in which the pull-in electrode moves back towards the equilibrium position. This limits the operating frequency of the device (e.g. scanning mirror). For some other positions of the rotation axis, the electrical force changes directions, but it is again of no assist either as an actuation or a restoration force in at least one of the quarter-periods of the moving element oscillations. For example, a device including in a mechanical equilibrium two vertically aligned electrodes, wherein the second electrode is allowed to move parallel to the first electrode, may not easily serve as an actuator. This is because the electrostatic force will always act to increase the electrodes overlap, i.e. to restore the mechanical equilibrium, and no assist to the moving element on its way from the equilibrium will thus be provided. (It should be understood that the parallel motion of the second electrode can be considered as equivalent to rotation of the second electrode around a remote axis). Therefore, the vertical comb drive actuators, employing the parallel motion of the electrodes, typically have these electrodes shifted in the mechanical equilibrium. However, as the inventors have found, for some positions of the rotation axis the device may have for the electrodes biased with a constant voltage three positions at which the electrical force or torque is zero. In other words, the inventors have found that within the suspension-defined motion path electrical energy reaches equilibrium at more than one position. This allows assisting the movement of the second electrode in each oscillation quarter and by electrostatic means, if the used oscillation amplitude is sufficiently large. In fact, if for example the second electrode moving along the suspension-defined motion path from the point of mechanical equilibrium crosses a point of the electrical equilibrium, the electrostatic force may be switched on and used together with the mechanical force to stop this element, reverse direction of its movement, and then to accelerate it to a high velocity allowing the element to fastly reach the point of mechanical equilibrium (i.e. in a time shorter than would be required has the restoring force been solely mechanical). The acceleration can be applied only in certain region of the motion path, in this example between the edge of the path and the point of electrical equilibrium, but since this acceleration is proportional to the square of the bias voltage at any point of the path, the moving element can be provided with a sufficient velocity for moving fastly through the rest of the quarter (the voltage bias may be switched off for movement through the rest of the quarter after the moving element crosses the point of electrical equilibrium; this will prevent delay the moving element by the electrostatic torque acting in decelerating manner in the rest of the quarter).

Hence, the inventors' technique may be used to overcome the limit on operating frequency of the device imposed on this frequency in the case of the solely mechanical restoring force. It should also be noted, that a possibility to stop the motion of the electrode by electrostatic force allows more precisely controlling the oscillation range. Moreover, it can be concluded that the existence of more than one point of electrical equilibrium is uniquely utilizable in actuation and can be used for controlling an operating frequency of the actuation, amplitude of the actuation, and dynamics of actuation, and also can be used for loosening requirements that parameters of the mechanical part of the device would need to satisfy if some specific frequency or dynamics of actuation would be needed while the restoring force would be only mechanical.

It should be added, that the device may be configured differently, so as to have in the suspension-defined tilt-involving motion path a single mechanical equilibrium and at a constant non-zero voltage two electrical equilibriums enclosing this mechanical equilibrium and so as still to be available for electrostatic oscillation adjustment. The adjustment in this case might be applied in a slightly different form and for fuller control in conditions in which deviation in one of the motion path directions is limited by the respective electrical equilibrium point. The latter can be shown on an example of a device which is electrically non-symmetrical at the mechanical equilibrium and for which, thereby, there exists a direction in which an application of a non-zero voltage would cause a deflecting force (a "stronger" direction). While in this direction the adjustment of oscillations may be done as before, in a weaker direction it may be preferable not to allow the movable element to cross the respective electrical equilibrium: beyond this equilibrium only mechanical restoring force will be left. Therefore, the deflecting electrostatic force will be available in an oscillation range between the mechanical equilibrium and the "strong"-direction electrical equilibrium and the restoring electrostatic force will be available in ranges beyond the "strong"-direction electrical equilibrium and between the mechanical equilibrium and the "weak"-direction electrical equilibrium. Accordingly, an adjustment scheme for oscillations will include an application to the electrodes a voltage signal with a waveform which will suite the movable element position in the motion path and will rely on producing that force/torque which will be available at the instantaneous position.

In conditions where there are two positions of electrical equilibrium three total and two stable electromechanical positions of equilibrium of the device can be observed for a sufficiently high voltage, because the electrical force at any fixed position of the motion path is proportional to the square of the bias voltage; the device therefore can be used for example for switching purposes.

In should be added, that the inventors' idea to use competing electrostatic attraction forces in the actuation can be very flexibly used if some electrodes are electrically isolated. For example, the device may include a pair of electrodes (one from a fixable electrode structure, one from a movable electrode structure) that act to cause movement in one direction upon application of a voltage, and a pair of electrodes that act to cause movement in opposite direction upon application of a voltage. The device then can be deflected from the mechanical equilibrium by one pair of electrodes and directed towards the equilibrium by the other pair of electrodes.

In one broad aspect of the invention, there is provided an electromechanical tilting device including a first and a second electrode structures, shaped, positioned and oriented to define at least partially interdigitated electrodes, and a suspension defining a tilt-containing motion path for the second structure with respect to the first structure; the motion path being selected to cause changes in overlapping regions and overlapping regions' gaps of the interdigitated electrodes, the device being configured such that an increase in one or more voltage bias applied to interdigitated driving electrodes makes a decrease in a total area of overlapping regions of the driving electrodes electrically energetically favorable.

The interdigitated electrodes can have a common material layer.

The tilt-containing motion path can include a rotation.

The device can be connected to one or more voltage source adapted to provide the bias, the device thereby being usable as an actuator. The device can include the one or more voltage sources. The one or more voltage source can include an ac voltage source. The one or more voltage sources can include a dc voltage source. The one or more voltage source can provide a sum of dc and ac voltage.

The suspension may include a torsion axis.

The interdigitated electrodes and the torsion axis can have a common material layer. The common material layer may be thinner in a region of the torsion axis than within electrodes of the second structure.

The torsion axis may be offset from an interdigitation axial center line of the second electrode structure.

The suspension may be electrically conductive.

The electrode may be elongated in a direction connecting the first and the second electrode structures.

The electrodes may overlap for more than two thirds of their area.

At least two of the electrodes of the same electrode structure may be connected to different voltage sources.

The motion path of the second electrode structure may be geometrically limited by the first electrode structure.

The actuator may be configured to have three stable states of equilibrium with no contact between the first and the second electrode structures or contact between the electrode structures and a mechanical constraining structure.

In another broad aspect of the invention there is provided an electromechanical tilting device comprising a first and a second electrode structures each defining at least one electrode and a suspension defining a tilt-involving motion path for the second structure with respect to the first structure, the device being configured to have, for the electrodes biased with a constant voltage, at least two positions of electrical equilibrium within said motion path.

In another broad aspect of the invention there is provided an electromechanical tilting device comprising a first and a second electrode structures and a suspension defining a motion path for the second structure with respect to the first structure, at least one of the structures comprising two electrically isolated electrodes, the device being configured to have in at least a portion of said motion path an electrically energetically favorable direction of motion being dependent on selection of whichever one of said two electrically isolated electrodes is biased.

In another broad aspect of the invention there is provided an electromechanical tilting device comprising a first and a second electrode structures each comprising at least one electrode and a suspension defining a motion path for the second structure with respect to the first structure, said motion path being selected to cause changes in overlapping regions and overlapping regions' gaps of the electrodes, the device being configured to have a portion of the motion path within which an application of a voltage bias to the electrodes makes a decrease in a total area of overlapping regions of the electrodes electrically energetically favorable.

In another broad aspect of the invention there is provided a device of including an excitation unit configured to excite the device at a parametric resonance frequency.

In another broad aspect of the invention there is provided a tunable tilting device comprising a holding element, a tilting element and a suspension structure coupling said elements and defining a tilt-containing motion path for the tilting element with respect to the holding element, the tilting element being substantially responsive to an actuating field of a type acting to cause a motion of the element along said motion path, the suspension structure being configured to bend with a certain bending stiffness to provide the tilting element said motion path, said suspension structure being substantially responsive to a tuning field which is of a type acting to change an extension stress of the structure and thereby to change the bending stiffness of the suspension structure.

In another broad aspect of the invention there is provided a method for use in tilting actuation, the method comprising exciting an electromechanical tilting device comprising a first and a second electrode structures, shaped, positioned and oriented to define at least partially interdigitated electrodes, and a suspension defining a tilt-containing motion path for the second structure with respect to the first structure, said motion path being selected to cause changes in overlapping regions and overlapping regions' gaps of the interdigitated electrodes, the device being configured such that an increase in one or more voltage bias applied to interdigitated driving electrodes makes a decrease in a total area of overlapping regions of the driving electrodes electrically energetically favorable.

BRIEF DESCRIPTION OF THE DRAWINGS

In order to understand the invention and to see how it may be carried out in practice, some embodiments will now be described, by way of non-limiting example only, with reference to the accompanying drawings, in which:

FIG. 3A illustrates an actuator with a symmetrically placed torsion axis and FIG. 3B illustrates an actuator with an offset torsion axis;

DETAILED DESCRIPTION OF EXEMPLARY EMBODIMENTS

Figure 1:
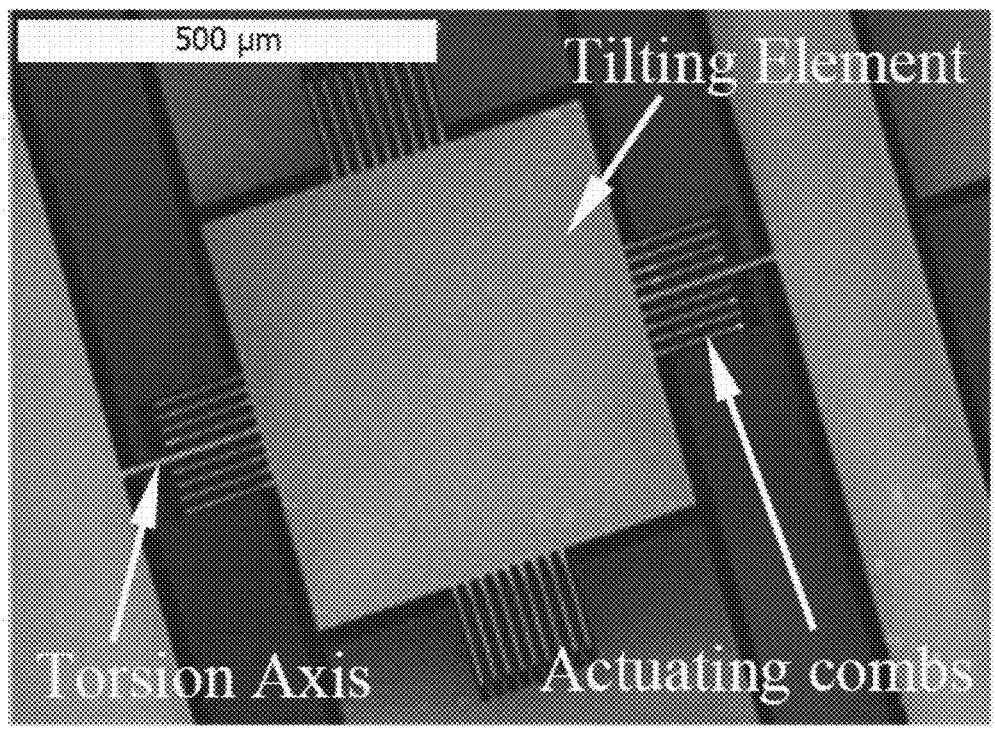
FIG. 1 is a SEM micrograph of a tilting device made by inventors according to their technique.

Referring to FIG. 1, there is shown a scanning electron microscopy (SEM) micrograph of an electromechanical tilting device fabricated by the inventors according to their technique. The scale bar in the upper left corner of the figure corresponds to 500 μm. The device incorporates a tilting element suspended from two sides using an elastic torsion axis and an array of comb-like high aspect ratio electrode structures oriented in a direction parallel to a rotation axis (defined by the torsion axis). The fingers of combs being on the same side of the tilting element are interdigitated. The combs are made from a single structural layer. Electrically, in this example, fingers (or teeth) of the same comb form a single electrode, but it is convenient to refer to each finger as to a separate electrode for electrical torque calculation and because the fingers of the same comb can be made electrically isolated. Comb-like electrode structures appear also at the upper and lower edges of the tilting element; these structures can be used for rotation sensing.

Figure 2:
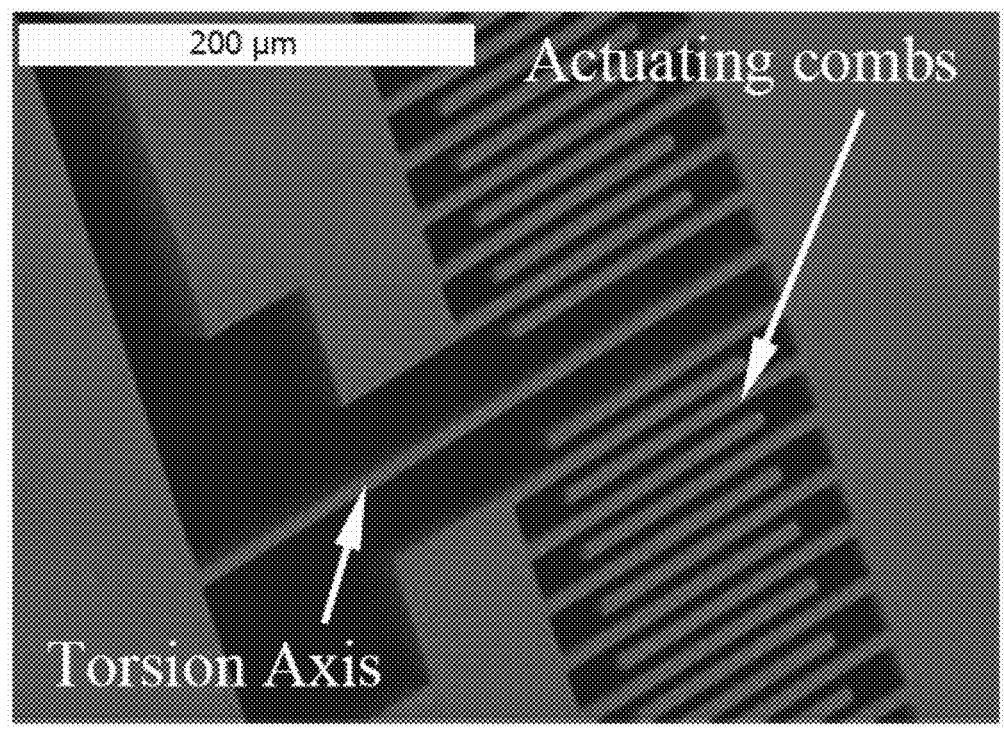
FIG. 2 is a SEM micrograph of actuating combs of the tilting device shown in FIG. 1.

FIG. 2 shows a SEM micrograph of the torsional axis and the actuating combs of the electromechanical tilting device shown in FIG. 1. The tilting element, the stationary and movable combs, and the torsion axis are fabricated from a single silicon-on-insulator (SOI) layer. The torsional axis is positioned symmetrically with respect to the shown combs. A scale bar in the upper left corner of the figure corresponds to 200 μm.

Figure 3A:
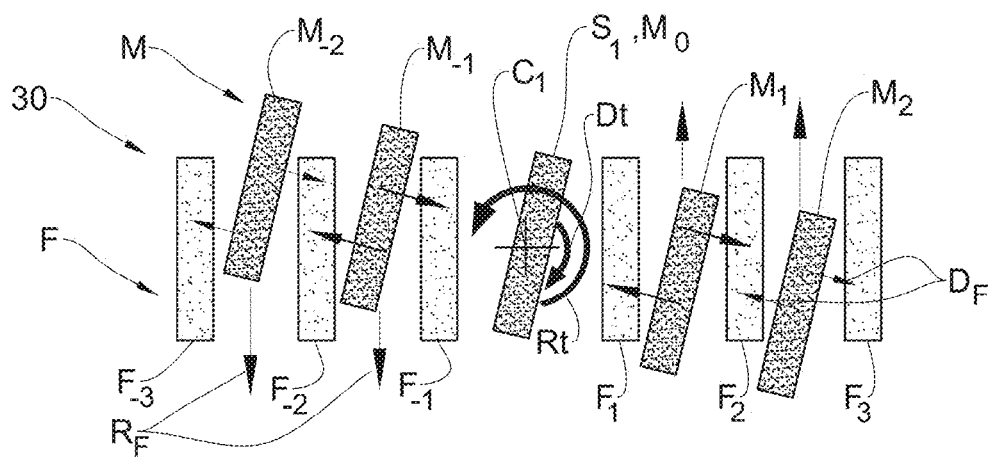
FIGS. 3A and 3B schematically show two actuators operating in accordance with the inventors' ideas.
Figure 3B:
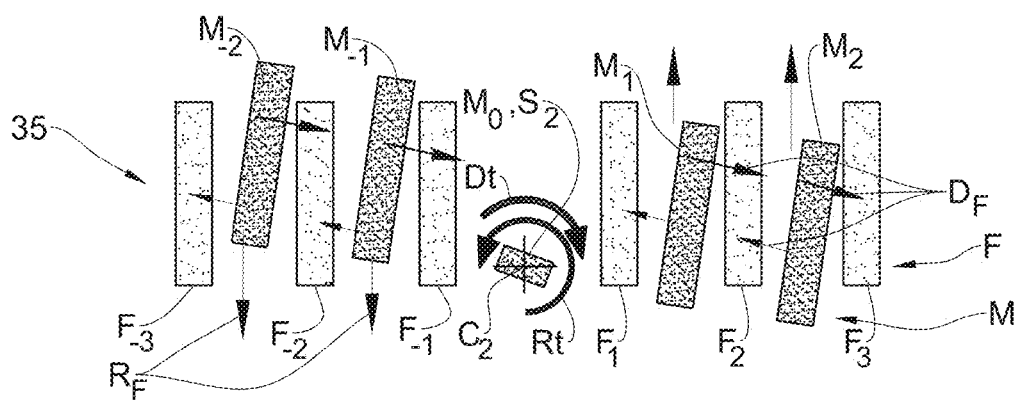

Referring to FIGS. 3A and 3B, they schematically show two actuators 30 and 35, which operate in accordance with the inventors' ideas. Each of the actuators includes six fixable electrodes $F_{-3}, F_{-2}, F_{-1}, F_1, F_2, F_3$ of a fixable (first) electrode structure F, five movable electrodes $M_{-2}, M_{-1}, M_0, M_1, M_2$ of a movable (second) electrode structure M, and a suspension S or $S_1$ presented by a torsional axis. (Electrode structures F and M are not shown in fill, but they can be similar to the comb electrode structures shown in FIG. 2). Electrodes $F_{-3}, F_{-2}, F_{-1}, F_1, F_2, F_3$ and electrodes $M_{-2}, M_{-1}, M_1, M_2$ are high aspect ratio or finger electrodes. Electrode $M_0$, is also a high aspect ratio electrode, but its end is not free, as it concurrently serves as the torsional axis (S) for the second electrode structure.

Actuators 30 and 35 differ in their suspensions: while in actuator 30 torsional axis $S_1$ and a center of rotation $C_1$ are placed symmetrically with respect to electrode structures F and M, in actuator 35 axis $S_2$ and center of rotation $C_2$ are shifted down (offset) from the center of symmetry. Also, torsional axes $S_1$ and $S_2$ are of different shape. Due to these differences, the functioning of actuators 30 and 35 is different in several aspects that will be specified several paragraphs below.

The operation principle utilized by the shown actuators is based on combining a close-gap type "deflecting" electrostatic torque $D_t$ and a comb-drive type "restoring" electrostatic torque $R_t$. Actuating torque $D_t$ is a result of electrostatic close-gap forces shown by dark-colored arrows and collectively marked $D_F$ (though in the figure not all close-gap force arrows are connected with the mark). Restoring torque $R_t$ is a result of electrostatic restoring comb-drive forces shown by light-colored arrows and collectively marked $R_F$ (again, in the figure not all arrows are connected with the mark). For larger forces the arrows are longer.

A non-uniform distribution of electrostatic forces $D_F$ acting on electrodes located closer to the rotation axis makes actuating torque $D_t$ increase with the deflection angle, as this is typical for close-gap actuators. Forces $R_F$ act to decrease overlap area between electrodes. At moderate deflection angles, forces $R_F$ are the largest for electrode pairs $F_{-3}$ and $M_{-2}$ and $F_3$ and $M_2$—i.e. for electrode pairs located farther away from the axis (until the angles at which electrode pairs $F_{-3}$ and $M_{-2}$ and $F_3$ and $M_2$ would basically become separated). The overlap area shrinks with the increase of the angle, while the gaps decrease with the increase of the angle—this makes torques $D_t$ and $R_t$ act in opposite directions. The connection between the decrease in overlap and the decrease in gaps is actually formed by internal geometry of the device (by the suspension and shapes, positions, and orientations of electrode structures).

The inventors have considered the dynamics of actuators 30 and 35 by studying the respective momentum equations and by comparing it with dynamics of some two-electrode actuators.

Moment equilibrium equation of a device viewed as a system with a single degree of freedom can be written in the form:

$$K\theta = M(\theta, V^2), \quad (1)$$

where $\theta$ is a tilting angle, K is a torsion stiffness of the axis, $M(\theta, V^2)$ is an electrostatic moment, and V is an actuating voltage.

Figure 4A:
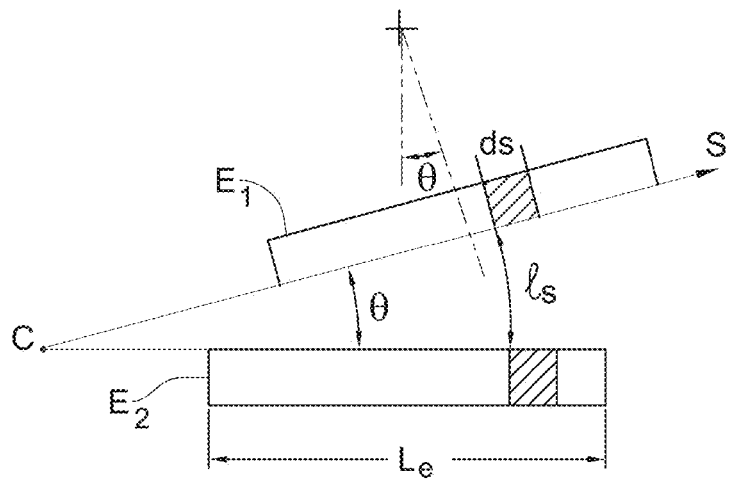
FIGS. 4A-4G schematically illustrate a method of calculation of the electrostatic torque (FIG. 4A), for two devices, the electric field mainly responsible for the creation of the electrostatic torque (FIGS. 4B and 4(C); for four devices, including an example of the invented device (FIG. 4F), an angular dependence of the torque (FIGS. 4D and 4G)

The electrostatic moment, which is calculated as a derivative of electric energy with respect to the tilting angle, can be written in the form $$M(\theta, V^2) = \frac{1}{2}\varepsilon_0 L_e V^2 \frac{d}{d\theta}\left[\int_{s_{min}(\theta)}^{s_{max}(\theta)} \frac{ds}{l_s(s, \theta)}\right], \quad (2)$$

where $\varepsilon_0$ is the permittivity of a free space (though, the actuator may be immersed in liquid or gas), $L_e$ is a length of an electrode, $l_s(s,\theta)$ is a length of a field line and s is a coordinate measured along the surface of a movable electrode. This is illustrated in FIG. 4A showing a fixable electrode $E_1$, a movable $E_2$ electrode, and a center of rotation C.

Figure 4B:
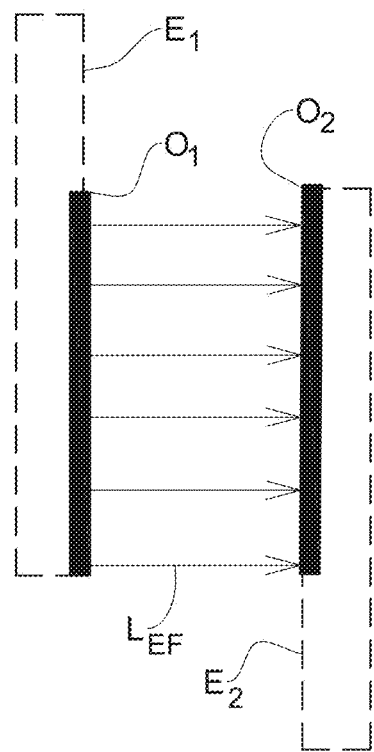
Figure 4C:
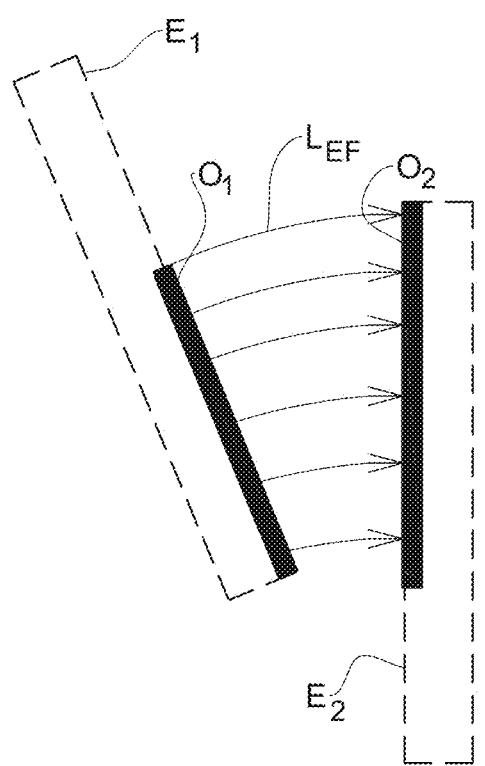

Electrostatic field lines used in the integral in equation (2) are illustrated also in FIGS. 4B and 4C. There these field lines, collectively marked as $L_{EF}$, start at electrode $E_1$ and finish at electrode $E_2$. Fringing field lines, i.e. those field lines that start or end at a backside (or at least not at a front side) of one of electrodes, either $E_1$ or $E_2$ were not drawn. Only those lines starting and finishing at overlapping regions $O_1$ and $O_2$ were drawn.

By denoting the derivative in Eq. (2) by $f(\theta)$ and introducing a non-dimensional voltage-related parameter $\beta = \varepsilon_0 L_e V^2 / (2K)$, the electromechanical equilibrium equation (1) can be put into the non-dimensional form $$\frac{\theta}{\beta} = f(\theta) \quad (3)$$

Equation (3) was used for the analysis of the behavior and stability of the devices.

However, before this, non-dimensional function $f(\theta)$, which is proportional to the electrostatic torque and depends only on geometry (shapes, positions, and orientation) of the electrodes, had been calculated analytically using computer algebra for various configurations of the electrodes and various locations of the center of rotation. The results are illustrative and presented in FIGS. 4D-4G.

Figure 4D:
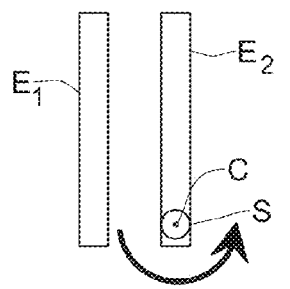
Figure 4D:
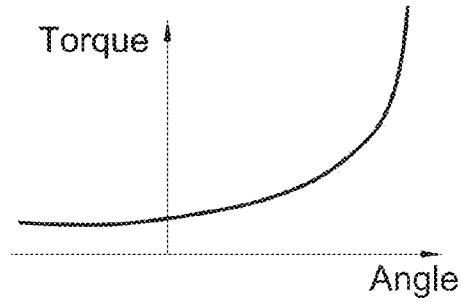

In the left half of FIG. 4D there is shown a close gap actuator 42, which suspension S is a torsional axis. The positive direction of rotation is shown by an arrow. In the right half of the figure there is a presented a graph of electrostatic torque dependence on deflection angle. As it is seen, an application of any voltage will act to decrease the gap between the electrodes. If such a close gap actuator is used in the oscillating regime, its frequency would be limited by mechanical force that would be the only restoring force for quarter-period (not in necessarily time, but in oscillation dynamics) from larger angles to smaller angles.

Figure 4E:
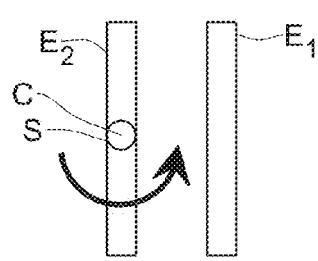
Figure 4E:
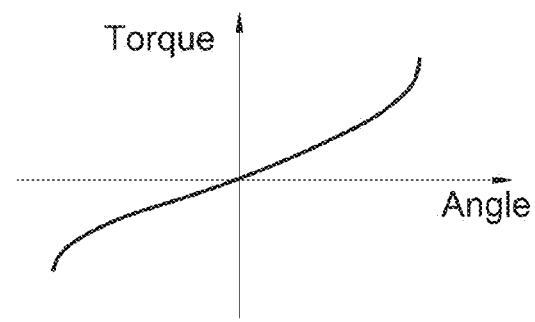

A device 44 shown in FIG. 4E has a suspension S (for example again a torsional axis) holding the movable electrode in its centerline. The torque behaves differently, however there electrostatic force again does not act as a restoring force.

Figure 4F:
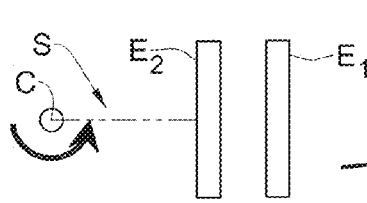
Figure 4F:
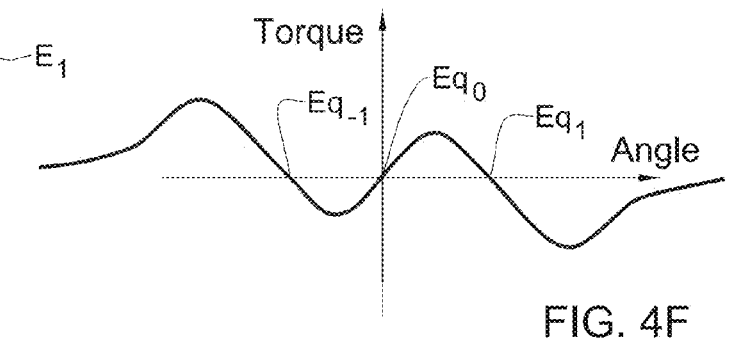

An actuator 46 shown in FIG. 4F is configured according to some of the inventors' ideas. The actuator has a center of rotation C for the movable electrode; the rotation is prescribed by a suspension S (the suspension can include for example a torsional axis at the center of rotation and a lever connected to it). Geometrical parameters of actuator 46 are selected to provide a graph of electrical torque with three zeros, or in other words, three points of electrical equilibrium: $Eq_{-1}$, $Eq_0$, and $Eq_1$. As discussed above, such actuator can be operated with unique dynamics: in any oscillation-quarter the moving element of the actuator can be accelerated electrostatically.

Figure 4G:
Figure 4G:
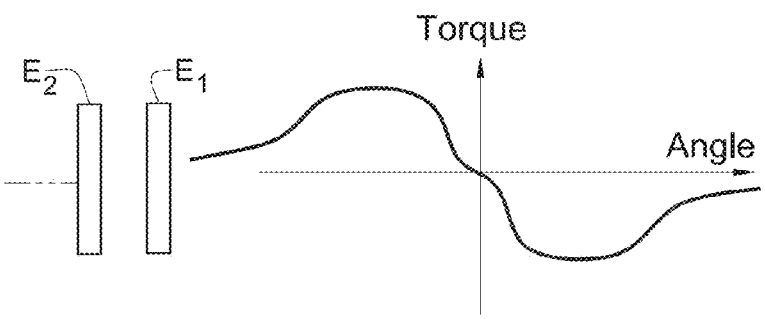

With regards to the selection of geometrical parameters for actuator 46, the following should be noted. A distance between the center of rotation and the electrode has to be not too small, otherwise the torque would behave similarly to that shown in FIG. 4E. Likewise, this distance is selected has to be not too large, otherwise electrode $E_2$ would be moving almost in parallel to electrode $E_1$ and the device would rather present a cell of vertical comb-drive (which torque graph does not have three zeros, as shown in FIG. 4G). A ratio between electrode length and electrode gap may is also a factor considered in design.

Turning again to the torque on angle dependence shown in FIG. 4F, this dependence can be explained: at small positive angles the torque is deflecting due to the tendency to decrease the electrodes' gap, and at large positive angles the torque is restoring due to the tendency to increase the electrodes' overlap. This idea can be kept for selecting free geometrical parameters in case electrodes and suspensions of a different geometry.

Figure 5A:
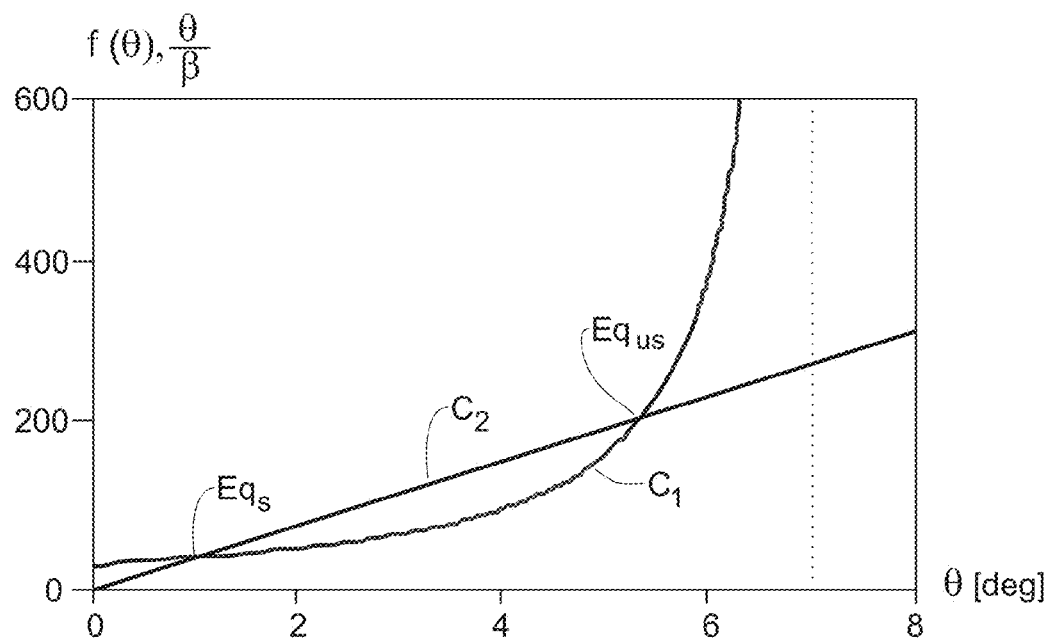
FIGS. 5A and 5B show, for a tilting device with an offset axis, dependencies of electrical and mechanical torques on deflection angle (FIG. 5A) and bifurcation diagram for an equilibrium equation based on these torques (FIG. 5B)

Turning back to equation (3), the inventors have used it for investigating the properties of the actuators 30 and 35 shown in FIGS. 3A and 3B. Both the right hand side, proportional to the electrostatic torque, and left hand side, proportional to the mechanical torque, of Eq. (3) were plotted as functions of the deflection angle in FIG. 5A for an exemplary actuator with the offset axis. The curved graph of the right hand function is marked $C_1$, the graph of the left hand function is marked $C_2$; this latter graph was built by using a value 1/40 degrees for voltage parameter $\beta$ (it was defined in degrees because the deflection angle $\theta$ was plotted in degrees). In the case plotted, the non-zero actuation moment exists even for zero deflection angle ($\theta = 0$) since the point of the application for the force resultant is located with a certain offset with respect to the axis of rotation. Graphs of the electrical torque and of the mechanical torque (i.e. $C_1$ and $C_2$) intersect twice at points $Eq_s$ and $Eq_{us}$; these intersections respectively correspond to stable and unstable electromechanical equilibriums.

Figure 5B:
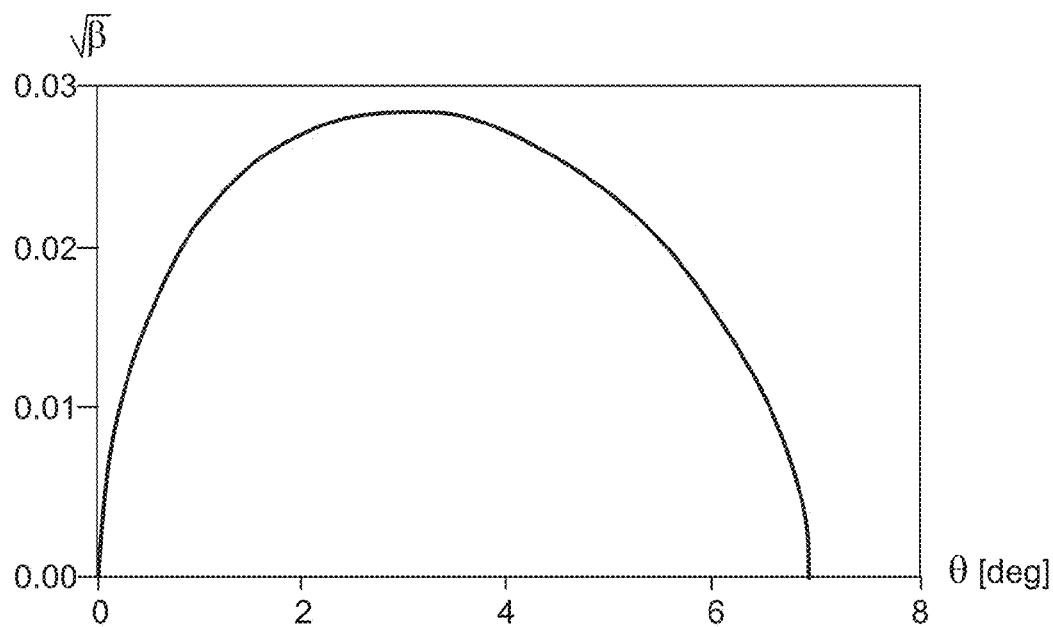

In FIG. 5B there is shown a bifurcation diagram for the simulated actuator with offset axis. Therein, a "relative voltage" $\beta^*$ is defined as a square root of the aforementioned non-dimensional voltage-related parameter $\beta$ (i.e. $\beta^* = \sqrt{\beta}$), and the values of this "relative voltage" are obtained by solving equation (3) for different angles (i.e. $\beta^* = \beta^*(\theta)$). Thus, in the diagram there is presented a set of equilibrium points for different voltages and angles. Those points situated on the diagram to the left from the maximal value of the graph are stable, and those situated to the right are unstable. The bifurcation diagram is typical for the close-gap configurations and the device can be actuated by a steady (DC) voltage.

Figure 6A:
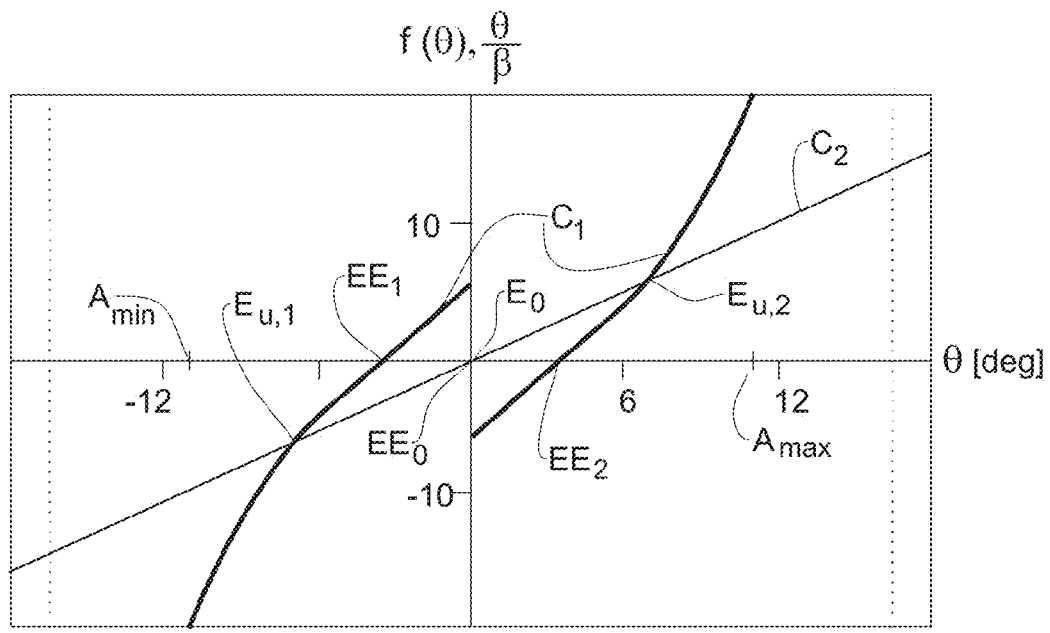
FIGS. 6A and 6B show, for a tilting device with an symmetrically-placed axis, dependencies of electrical and mechanical torques on deflection angle (FIG. 6A) and bifurcation diagram for an equilibrium equation based on these torques (FIG. 6B)
Figure 6B:
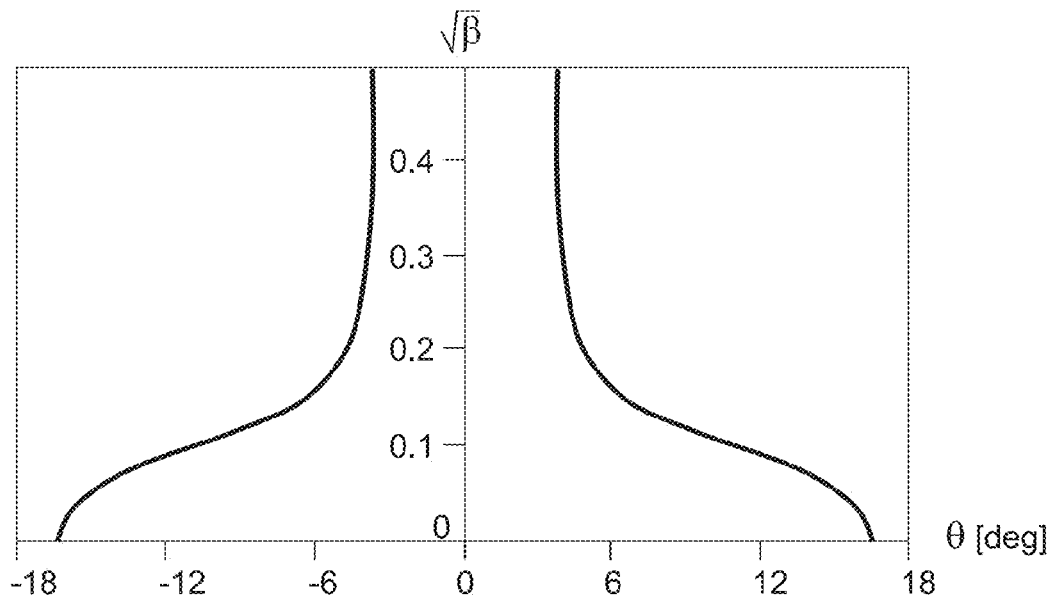

Returning to actuator having a symmetrically placed torsion axis and whose geometry is illustrated in FIG. 3A (the actuator 30), results of a study of an exemplary of such an actuator are presented in FIGS. 6A and 6B and FIGS. 7A and 7B. In case of symmetrically placed torsion axis, the actuating moment is zero for any voltage for the symmetrical position of the tilting element (i.e. for deflection angle θ=0). Further, this undeformed configuration may be conditionally or unconditionally stable "in small". Two torques can participate in providing the electromechanical stability to the undeformed configuration: the mechanical and the "restoring" electrostatic "comb mode" moments. If a large voltage is applied to the electrodes, that in case of a typical perturbation from the undeformed configuration the mechanical moment might not the stop the tilting, the stability will rather be determined in "fight" between the "close-gap" and "vertical comb drive" modes. Which mode will win depends on selection of geometrical parameters of the actuator. The result of the fight is though sensitive to the probability distribution of perturbations: in a case of a large perturbation, the device may become unstable, because the close-gap mode can grow fast. This is illustrated by FIGS. 6A and 6B. There, as in FIG. 5A, curve $C_1$ follows the right hand function of Eq. (3), straight line $C_2$ follows the left hand function of Eq. (3); and the latter graph was built by using a value 1/50 degrees for voltage parameter β, while the deflection angle (was plotted in degrees. Graphs $C_1$ and $C_2$ intersect three times: at stable equilibrium $E_0$ and at unstable equilibriums $E_{u,1}$ and $E_{u,2}$. If a dc voltage corresponding to the selected voltage parameter β is applied beyond one of these equilibriums, the tilting device will increase its tilt (actuate). The actuation even could start from points being immediately to the left from an electrical equilibrium $EE_1$ or to the right from an electrical equilibrium $EE_2$, had the voltage parameter voltage parameter β been larger. (The third electrical equilibrium $EE_0$ coincides with mechanical electromechanical equilibrium $E_0$). However, in the example of FIG. 6A and case of de voltage the actuation first would need to be activated by a perturbation and second would lead to diverging angle of tilt, because the equilibriums $E_{u,1}$ and $E_{u,2}$ are unstable. (The corresponding bifurcation diagram is shown in FIG. 6B) Accordingly, in the example of FIG. 6A the tilting device is more suitable to be used as an actuator in resonant mode.

In this connection, it should be noted, that the resonance excited in the tilting to device can be of a parametric type. This relates to the aforementioned technique of frequency adjustment; the idea to switch on the voltage bias in correlation with the electrical torque is used in the parametric resonance as well. Considering for example oscillations between angles $A_{min}$ and $A_{max}$ the actuation may be achieved as follows. Initially, no voltage is applied and the tilting element is in electromechanical equilibrium $E_0$. A small perturbation displaces the tilting element from this equilibrium, the angle slightly increases and then starts to decrease, but at this moment the voltage bias is switched on. This voltage bias accelerates the tilting element and it passes by equilibrium $E_0$ on a certain velocity; and it also passes by electrical equilibrium $EE_0$. Here, the voltage bias is switched off. It will be switched on next time when the direction of tilting element movement and the acceleration provided by the electric torque will again coincide in direction. Due to the acquired velocity, the tilting element will deflect from equilibrium $E_0$ farther than after the initial perturbation. Thus, the initial perturbation will be amplified. The amplification can be continued as in parametric resonance when the perturbation becomes so large, that the tilting element will pass beyond electrical equilibriums $EE_1$ and $EE_2$. For better amplification, the voltage bias will have to be switched on/off at zero angle, at maximum and minimum angles, and at the electrical equilibriums. In total, a period of oscillation can be split in eight parts in four of which the voltage bias should be on to provide the amplification. The voltage bias will thus amplify oscillations of the tilting element if a frequency of the voltage bias change is about two times higher than the frequency of free oscillation of the tilting element on the suspension. This is a trace of the parametric resonance phenomenon. In accordance with it, the tilting device has frequency bands in which the voltage bias will actuate the oscillation. These bands are typically broader than the peak of free oscillation resonance with the same damping. Such broad resonances find utility in many cases, especially in those where the free resonance frequency of the tilting device can not be provided by fabrication or tuning reliably or where the frequency of the actuating signal can not be predicted or will be a subject to change.

Figure 7A:
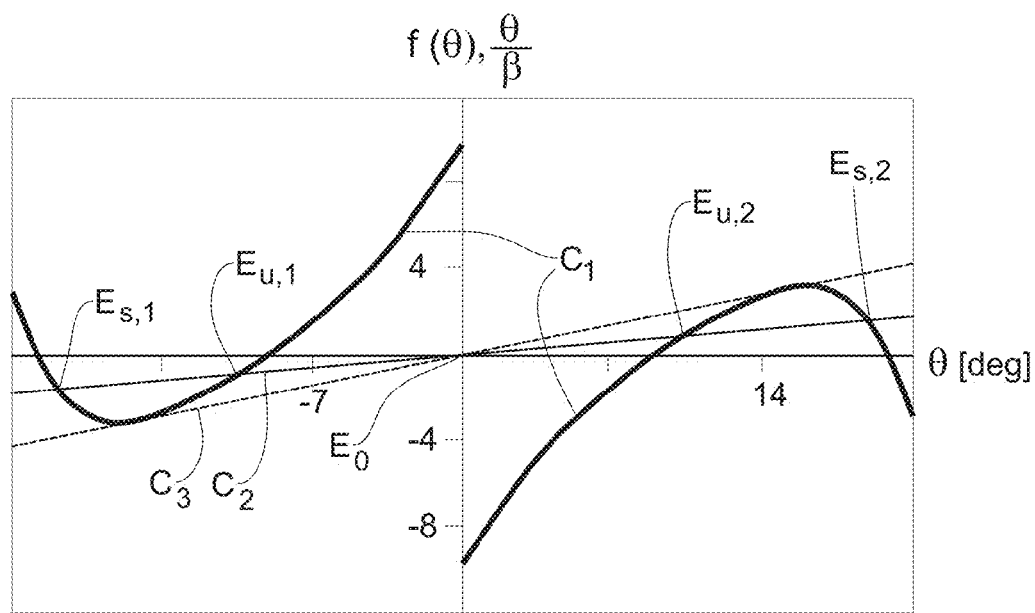
FIGS. 7A and 7B show, for yet another tilting device with a symmetrically-placed axis, dependencies of electrical and mechanical torques on deflection angle (FIG. 7A) and bifurcation diagram for an equilibrium equation based on these torques (FIG. 7B)
Figure 7B:
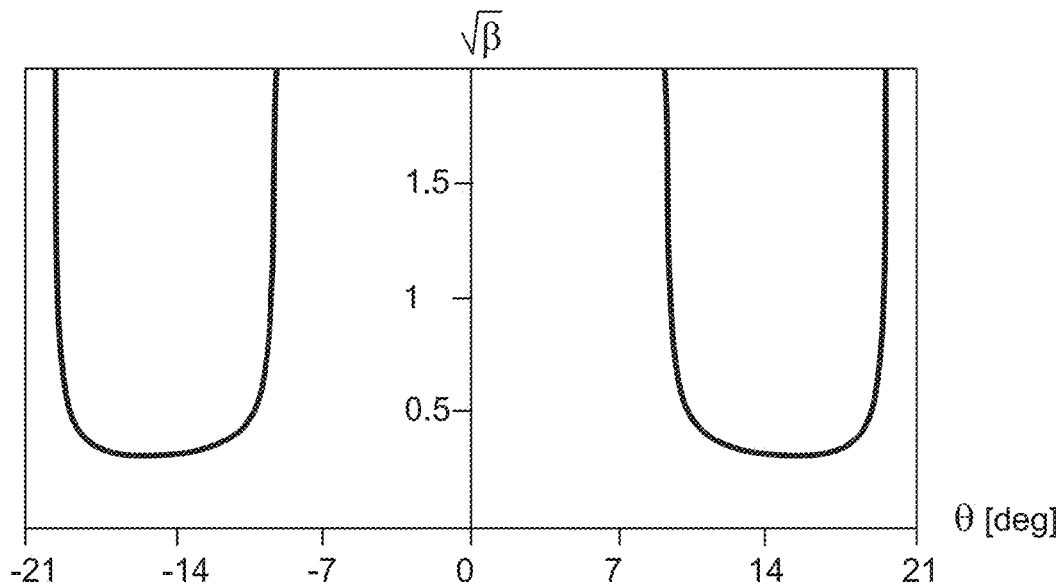

Referring to FIGS. 7A and 7B, there are illustrated results of electromechanical simulation for yet another device with symmetrically placed axis. In this case, the configuration of electrodes is such that that a multistable behavior is observed: an electrical torque curve $C_1$ in FIG. 7A goes differently from FIG. 6A and two additional stable equilibriums—intersections $E_{s,1}$ and $E_{s,2}$ with the mechanical torque line $C_2$—exist (in addition to the undeformed state $E_0$). The voltage parameter β used for building line $C_2$ was 1/5. These stable equilibrium states may not exist if the voltage bias would be lower: a bias at which they appear first corresponded to the voltage parameter β=1/11.5, as it is seen from yet another mechanical torque line $C_3$. The found by inventors additional stable equilibrium states are seen also in a bifurcation diagram shown in FIG. 7B. These stable states can be utilized in various applications for logic-type operations; the tilting device will thus be useable for example as a switch. It therefore should be clear, that a designer will have some flexibility while she or he has to choose an electrical torque angle dependence for her or his application.

It should be added, that the above analyses used formula (3) and relied on a simplified model for electrostatic force calculation and a simplified lumped model of the device. This model neglected a possibility of the in-plane and out-of plane motion and disregarded the contribution of the fringing fields in the electrostatic moment.

The following should be noted on differences between the offset and symmetrical torsional axis designs. While the resonant operation is available for both designs, the offset design tends to be unstable in the initial position and therefore more suitable for a pure dc operation. Additionally, the offset torsional axis design side can prevent the movable element from the side pull-in. At the same time, the symmetrical-placed axis design may even not have a stable electromechanical equilibrium besides the center. Though, in some configurations of the tilting device the symmetrical-placed axis design has additional stable equilibriums at sufficiently high voltages and can be switched between these states by appropriate random or intentional perturbations.

Despite the differences, the inventors have considered that in both designs large titling angles are achievable if a ratio between height of the electrodes and a gap between them is small. The height of the electrodes can be small when the electrodes are produced from a device layer of a SOI wafer: the height can correspond to a thickness of the device layer of such wafer and the gap can correspond to features of a photolithography mask.

As well, it should be noted that the actuation can be done with a small number of electrodes and that these electrodes can be located near the axis. This allows fabricating small size devices.

Figure 8:
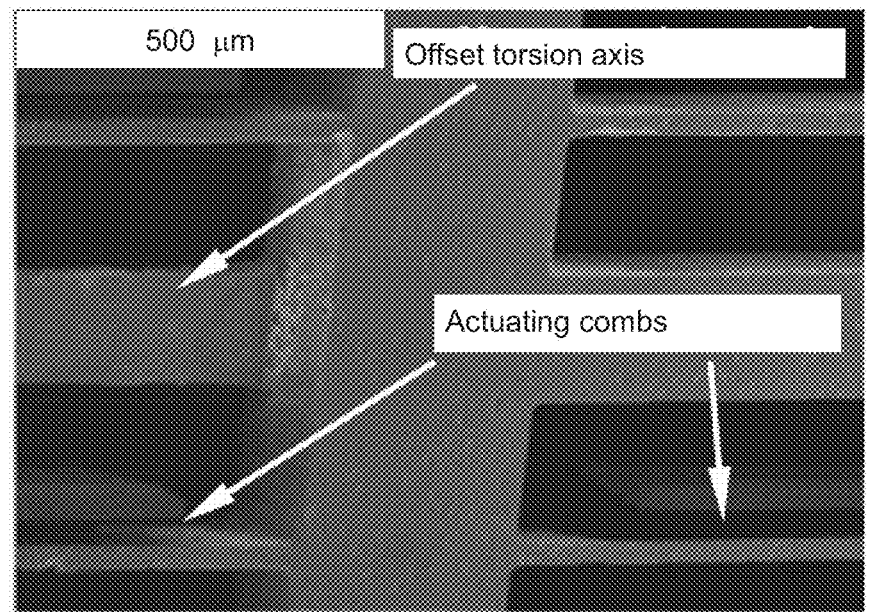
FIG. 8 is a SEM micrograph of a device with an offset torsion axis.
Figure 9:
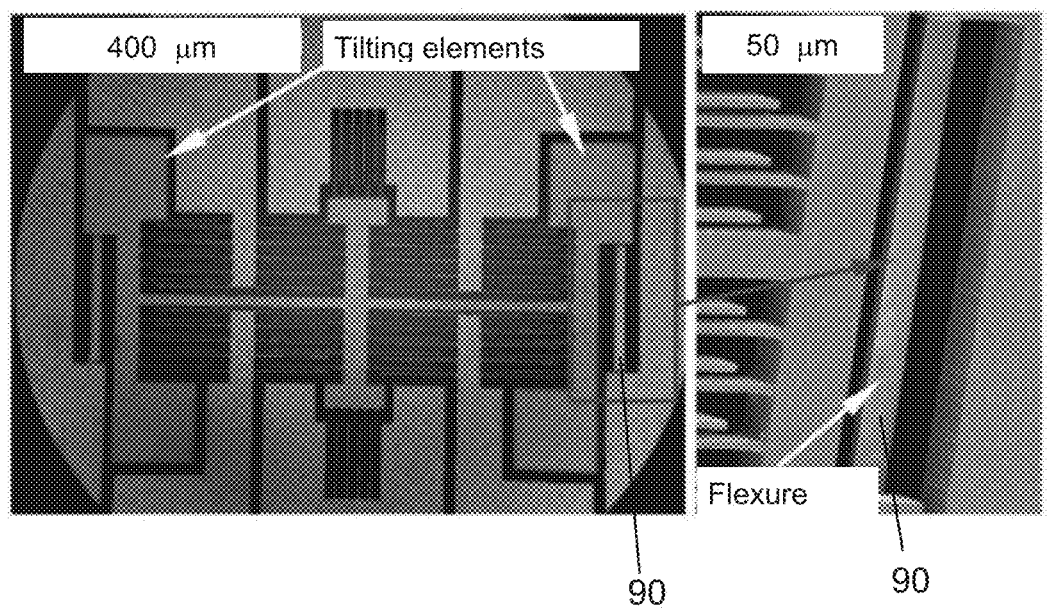
FIG. 9 is a SEM micrograph of a single layer device with a virtual offset axis realized using a bending flexure.

The inventors have verified the functionality of several devices built in accordance with their ideas by experiments. To this end, devices of three different configurations were fabricated. Devices shown in FIGS. 1 and 2 incorporated an elastic symmetric torsion axis; a device shown in FIG. 8 included an offset torsion axis; and a device shown in FIG. 9 used a suspension providing a virtual axis (such a suspension was realized by bending flexures; a flexure 90 of these flexures is shown in the left and right parts of FIG. 9, as the right part provides a magnified image of a region of the left part). The devices were fabricated using SOI wafers as a staring material and Deep Reactive ion Etching (DRIE) base process. In all cases the device architecture was such, that it could be fabricated by a simple fabrication process requiring no precise alignment. (Though, it can be noted that the fabrication of the offset torsion axis used a combination of photoresist and silicon dioxide masks and used critically timed etch stop (front side DRIE); however, this only insignificantly complicated the process, because the offset axis was 15-20 μm wide and therefore did not require precise alignment; such fabrication was simpler than the fabrication of typical 3-4 μm wide comb electrodes by similar technique).

The fabricated devices were operated in air and their dynamic and for offset axis also static optical responses were registered. In particular, the optical angle of a laser beam scanned by the fabricated titling devices, was measured. The optical angle was then transformed, by dividing over 4, into the mechanical titling angle (peak to peak, pk-pk).

Figure 10:
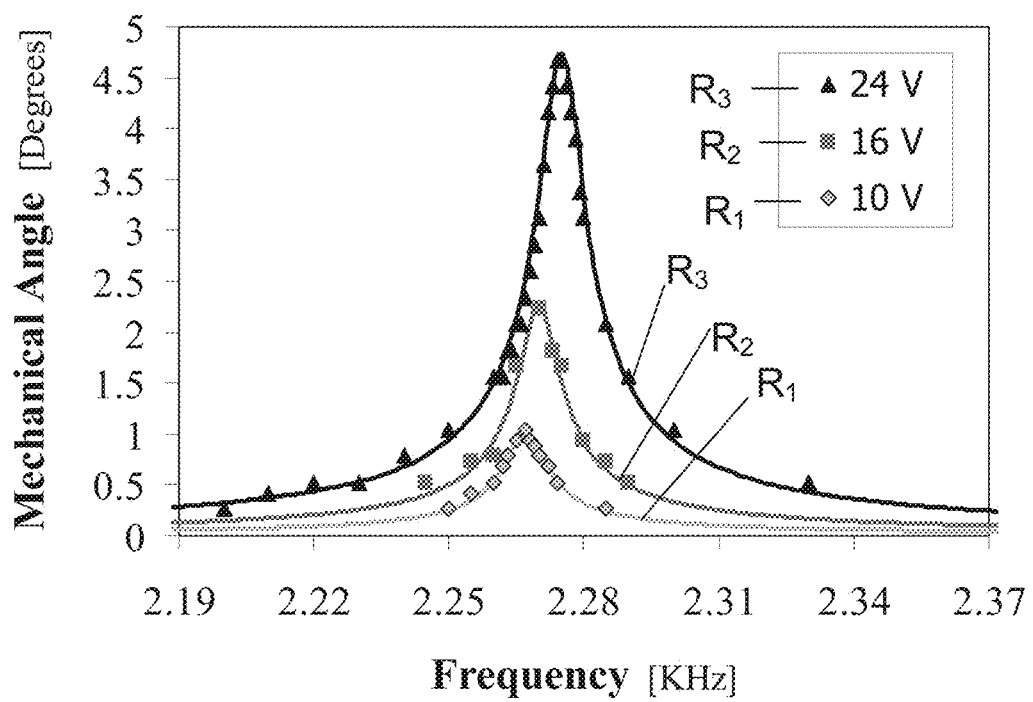
FIG. 10 shows a family of resonant curves for a device with symmetrically-placed torsion axis; an estimated quality factor is Q=250.

In FIG. 10, a family of resonant curves $R_1$-$R_3$ for the device with the symmetrically placed torsion axis is shown. The curves are distinguished by voltage bias applied to the electrode structures: curve. They correspond, respectively, to 10 V, 16 V and 24 V bias. It is seen from these curves, that the device with a symmetrically placed torsion axis exhibited typical nonlinear parametric resonant behavior: the resonance peaks were fairly broad.

Figure 11:
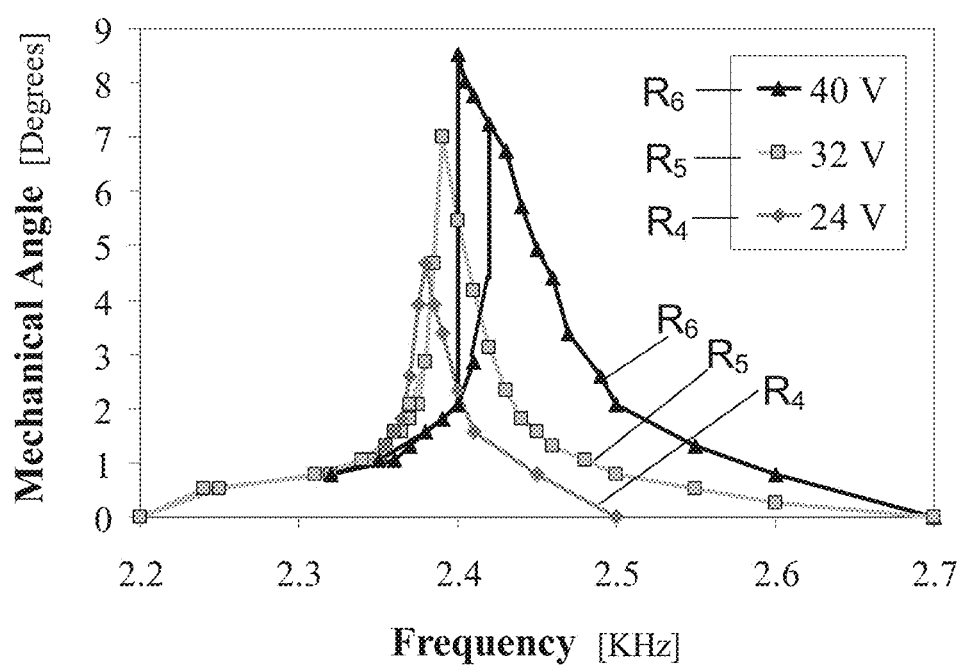
FIG. 11 shows a family of resonant curves for yet another device with symmetrically-placed torsion axis.

In FIG. 11, resonant curves for another exemplary device with symmetrically-placed torsion axis are shown. These curves $R_4$-$R_6$ were obtained with voltages 24 V, 32 V, and 40 V, respectively, and yielded large tilting angles.

Considering the device with the bending flexure suspension, in this case typical Duffing-type oscillator behavior with soft nonlinearity originating in the electrostatic force was observed. In the case of the offset torsion axis, linear Lorentzian resonant curves were registered. In all cases, it was found that large mechanical titling angles up to 24 degree pk-pk are achievable due to small height of the close-gap electrodes equal to the thickness of the SOI device layer.

Figure 12:
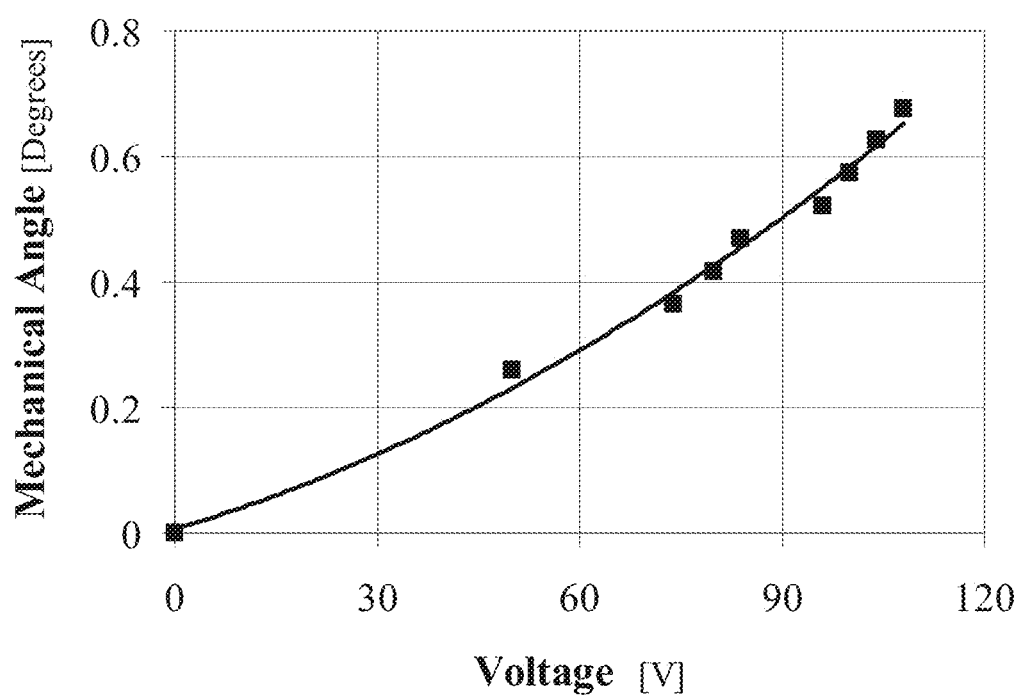
FIG. 12 demonstrates a static response of a device with an offset axis actuated by the steady DC voltage.

In addition to the resonant operation, static out-of-plane response of the actuators with the offset torsion axis and bending flexures to the DC voltage was demonstrated. In FIG. 12, there is shown such a static response for the case with the offset axis. The device was actuated by a steady DC voltage. Further increase of the voltage resulted in pull-in instability.

As it was mentioned above the devices with which the inventors experimented had been made with a relatively simple fabrication process: the inventors had managed to use a single precise mask and not to use precise alignment. The fabrication process was robust and resulted in robustly working device. Details of this fabrication process are provided herein.

Figure 13A:
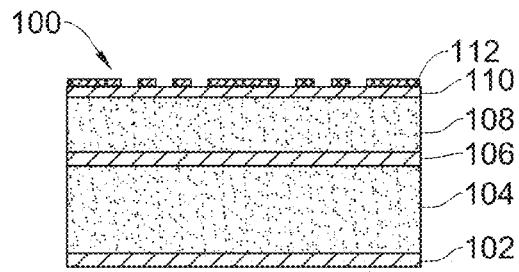
FIGS. 13A-13H illustrate fabrication steps for a device with a symmetrically placed torsion axis.

FIGS. 13A-13H illustrate a process which was used for fabricating the device with symmetrically placed axis. The process started with a step of covering a SOI wafer with a photoresist and patterning the photoresist, by a mask similar to the views shown in FIGS. 1 and 2. A processed wafer 100 (i.e. a wafer obtained in result of these operations) is shown in FIG. 13A. It includes the following layers: silicon layers 104 and 108, silicon oxide layers 102, 106 and 110, and patterned photoresist layer 112. In FIG. 13A and other figures layers drawn in different textures correspond to materials of different chemical compositions.

Figure 13E:
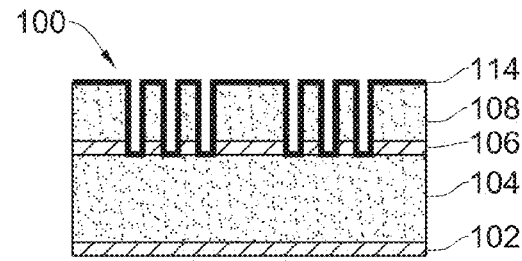
Figure 13B:
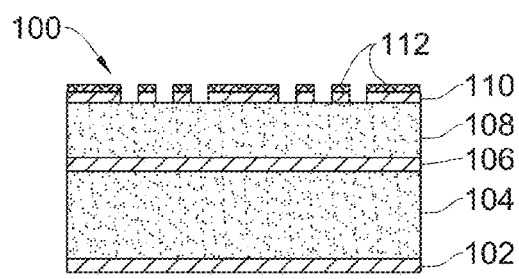
Figure 13F:
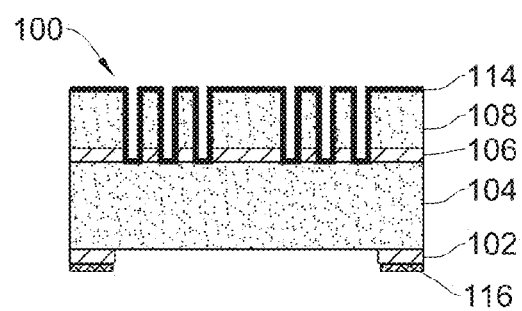
Figure 13C:
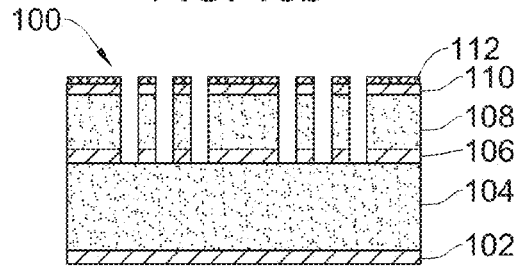

The inventors followed to process wafer 100 by etching: first they applied an RIE etch through layer 110, thereby obtaining a stack shown in FIG. 13B and preparing layer 110 for future serve as a hard mask; then they applied a DRIE etching through device layer 108; and after that they applied the RIE again—for etching through layer 106 and obtaining thereby a stack shown in FIG. 13C.

Figure 13G:
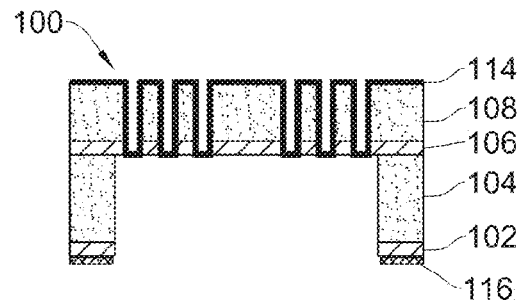
Figure 13D:
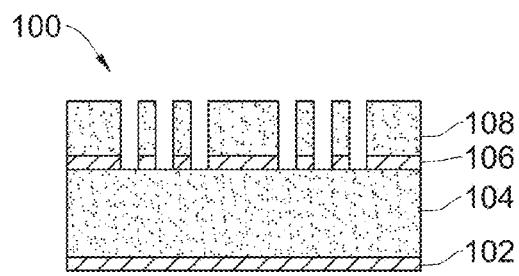

FIG. 13D shows that photoresist layer 112 and silicon oxide layer 110 were removed: the photoresist could be washed away after the hard mask was produced and the hard mask could be removed either by a separate RIE process or by the RIE process used for removal of layer 106.

FIG. 13E shows that the inventors continued the fabrication with a PCVD deposition of a silicon oxide layer 114. This deposition was optional and fabrication could go without it, but the inventors had invented to use it for fabrication of the tilting device; this way they were able compensate the residual stress in silicon oxide layer 106 and also to protect device layer 108 from the front side in etch processes that followed.

Figure 13H:
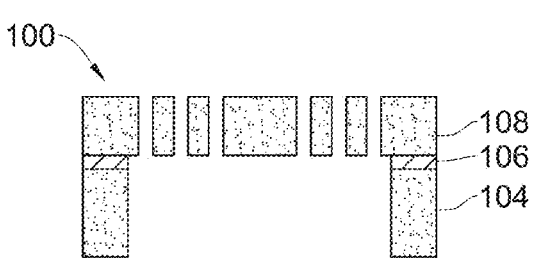

FIGS. 13F and 13G illustrate that wafer 100 then was etched from the back (in particular, deeply etched for obtaining a stack shown in FIG. 13G). FIG. 13H illustrates that the electrodes were then released.

The inventors have also contemplated that the DRIE process used for obtaining the stack in FIG. 13G can be used also for facilitating the dice separation. To this end, they incorporated channels into a photolithography mask that was used for patterning the backside of the wafer: the channel circumvented different dices but had bridges in them. The silicon in channels was the removed by the DRIE, however the silicon under the bridges stayed and held the dices together when the wafer was processed into the stack shown in FIG. 13H. Then, the bridges were broken mechanically and the dices were separated, while the need to dice the wafer was eliminated. Such a process eliminated the risk of particles and breakage during the mechanical dicing by dicing saw.

Figure 14A:
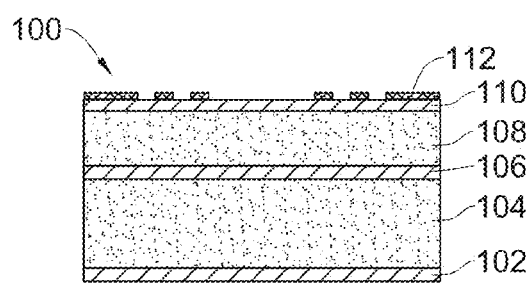
FIGS. 14A-14J illustrate fabrication steps for a device with an offset torsion axis.
Figure 14B:
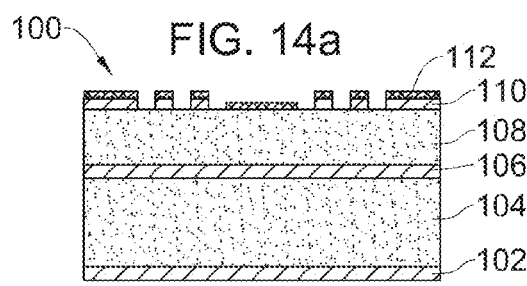
Figure 14C:
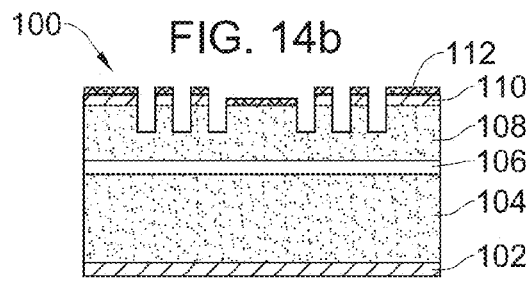
Figure 14D:
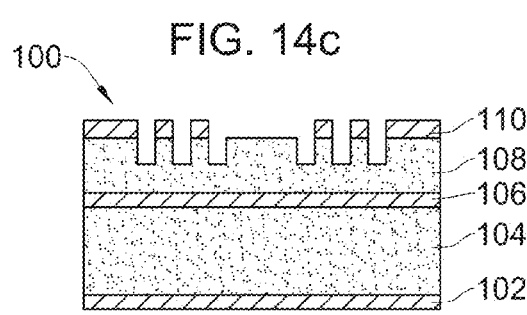
Figure 14E:
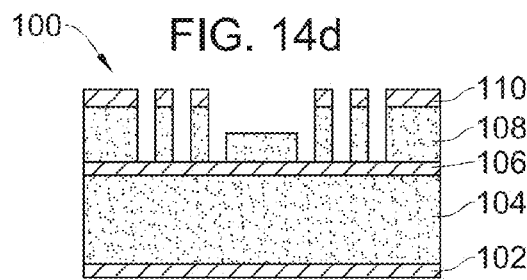
Figure 14F:
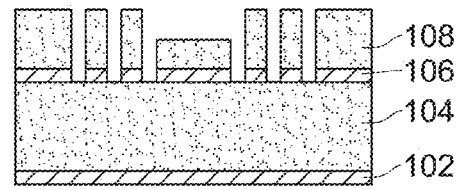
Figure 14G:
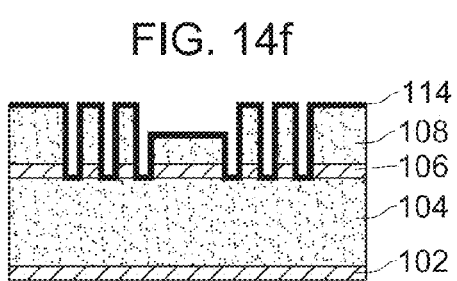
Figure 14H:
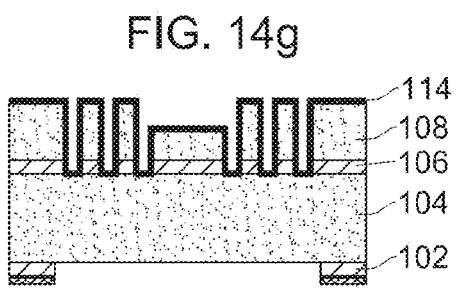
Figure 14I:
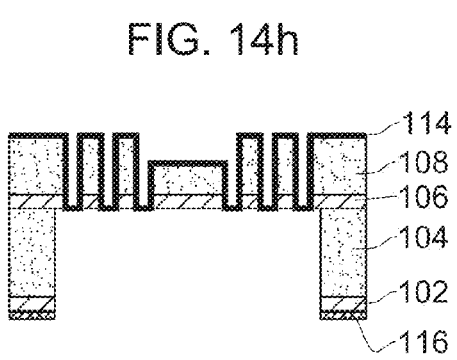
Figure 14J:
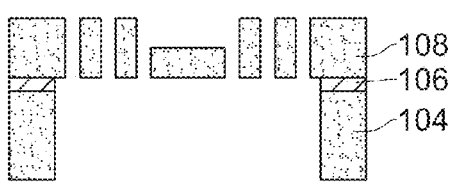

FIGS. 14A-14H illustrate a process which was used for fabricating the device with an offset axis. This process included a critically timed etch stop: the wafer after such etch is shown in FIG. 14C. Other operations applied to the wafer in the course of the fabrication process can be seen from the respective figures, which are on one hand self-explanatory and on the other hand analogous to FIGS. 13A-13H.

It should be noted that not only the SOI technology can be used for fabrication of the tilting device. With respect to the choice of material from which the tilting device can be fabricated, this material may be or may suitably include single-crystalline silicon, poly-crystalline silicon, amorphous silicon, ceramic, silicon-oxide, silicon-nitride, single-crystalline silicon-germanium, polycrystalline silicon-germanium, or a metal (such as nickel, chromium, aluminum or gold). It should be understood, that this list does not limit choices for the material of the device and that different materials may be combined.

The inventors have not only constructed the tilting device in its various embodiments, but they also have considered options for tuning this device. Henceforth they found out a novel way of tuning the tilting devices: such a device (electrostatic or not, described above or not) can be tuned by causing an extension stress in its suspension if the suspension is selected in such a way that it bends to allow the tilting element's motion along the motion path.

According to this idea, a tunable tilting device may include a holding element, a tilting element and a suspension structure coupling these elements and defining a tilt-involving motion path for the tilting element with respect to the holding element. The referred herein tilting element is substantially responsive to an actuating field of a type acting to cause a motion of the element along the motion path. The suspension structure is configured to bend with a certain bending stiffness to provide the tilting element the motion path. The suspension structure is also substantially responsive to a tuning field which is of a type acting to change an extension stress of the structure and thereby to change the bending stiffness of the suspension structure.

Such an approach developed by the inventors allows fine linear tuning of the resonant frequency in tilting oscillators; and it brings up an ability to perform linear tuning for large angle tilting oscillators, with no mechanical contact or impact involved.

The idea of the inventors relates to the following. Tilting actuators typically include a titling element suspended using a compliant elastic torsion axes or bending flexures. The inventors can provide the mechanical restoring torque by, for example, a pair of elastic flexure suspensions built in such a way that the actual pivot (center of rotation) is replaced by a virtual one. This is illustrated in FIGS. 15, and 16A and 16B.

Figure 15:
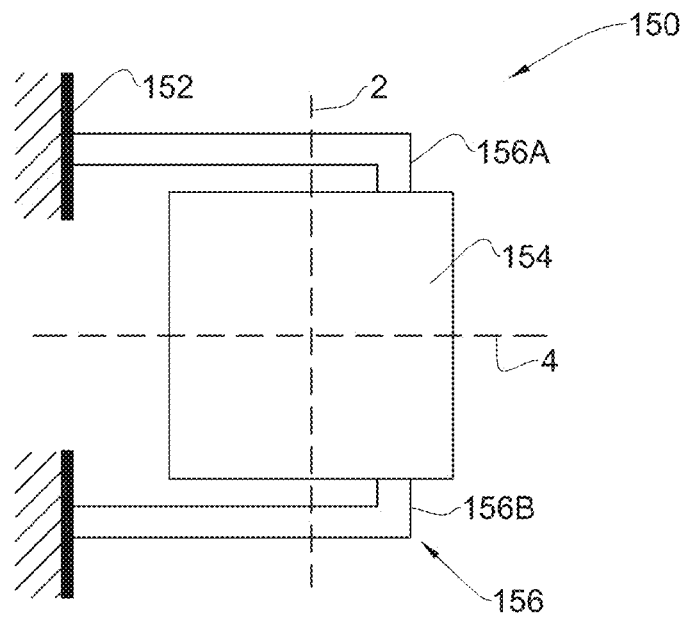
FIG. 15 shows a tilting device having a rotating element suspended on bending flexure.
Figure 16A:
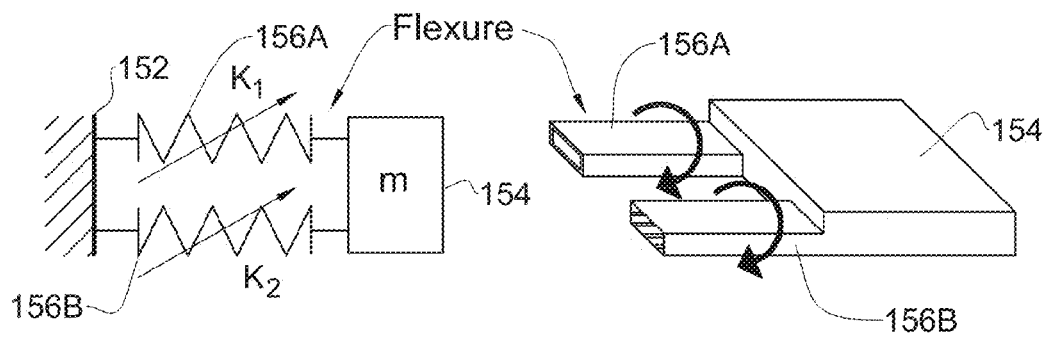
FIGS. 16A and 16B illustrate a mechanical structure of a tilting device having a rotating element suspended on bending flexure.
Figure 16B:
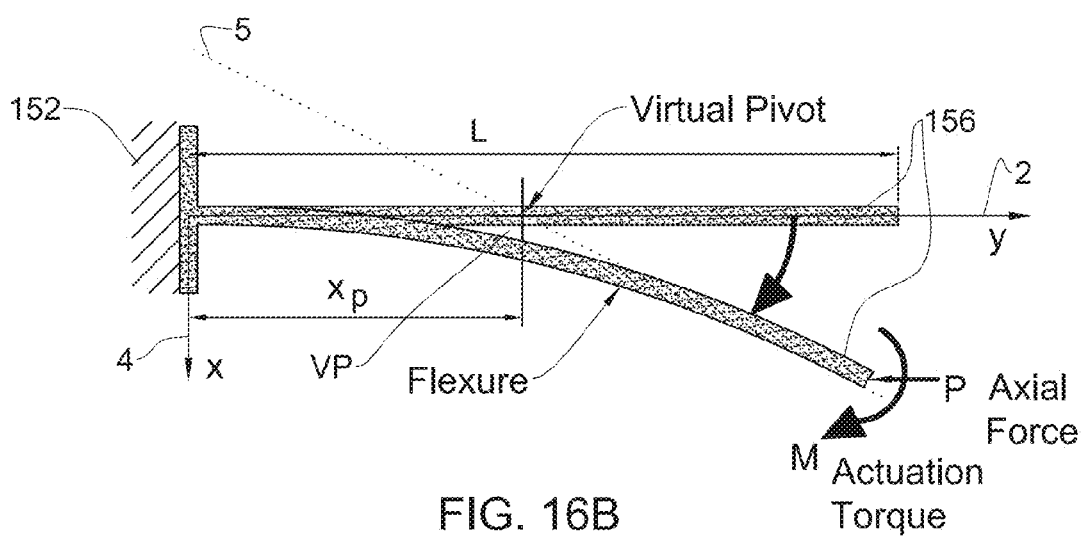

In FIG. 15, a tunable device 150 includes a holding element 152, a tilting element 154, and a suspension 156 including two elastic flexure suspensions 156A and 156B. Line 2 shows a virtual pivot for rotation in which velocities of symmetrical points on flexures 156A and 156B look in the same direction. Line 4 an instantaneous axis for another possible rotation: this rotation occurs when velocities of symmetrical points on flexures 156A and 156B look in opposite directions.

A mechanical model of tilting device 150 is shown in FIG. 16. There flexure 156A is presented as a spring with variable stiffness $K_1$ and flexure 156B is presented as a spring with variable stiffness $K_2$. Tilting element 154 is presented as a mass m. In the right part of this figure it is shown how element 154 might rotate in the second dimension, i.e. around axis 4.

The bending stiffness of flexure 156 and consequently its equivalent torsional stiffness (also called effective torsional stiffness) is dependent on an axial force (P) applied to the flexure's end. In FIG. 16B the bending of a flexure 156 is illustrated. In mechanical equilibrium the flexure is almost horizontal. When force P is applied, the flexure flexes and its free end moves—rotation around a virtual pivot VP. Location of the pivot depends on the axial force P applied to the flexure's end. It is worth noting that in the case of small tilting angles and axial loads, location of a point (VP) where a line 5, being tangent to beam at its end, crosses the v-axis (line 2) is independent of deflection therefore point VP can be considered as a virtual pivot.

Figure 17:
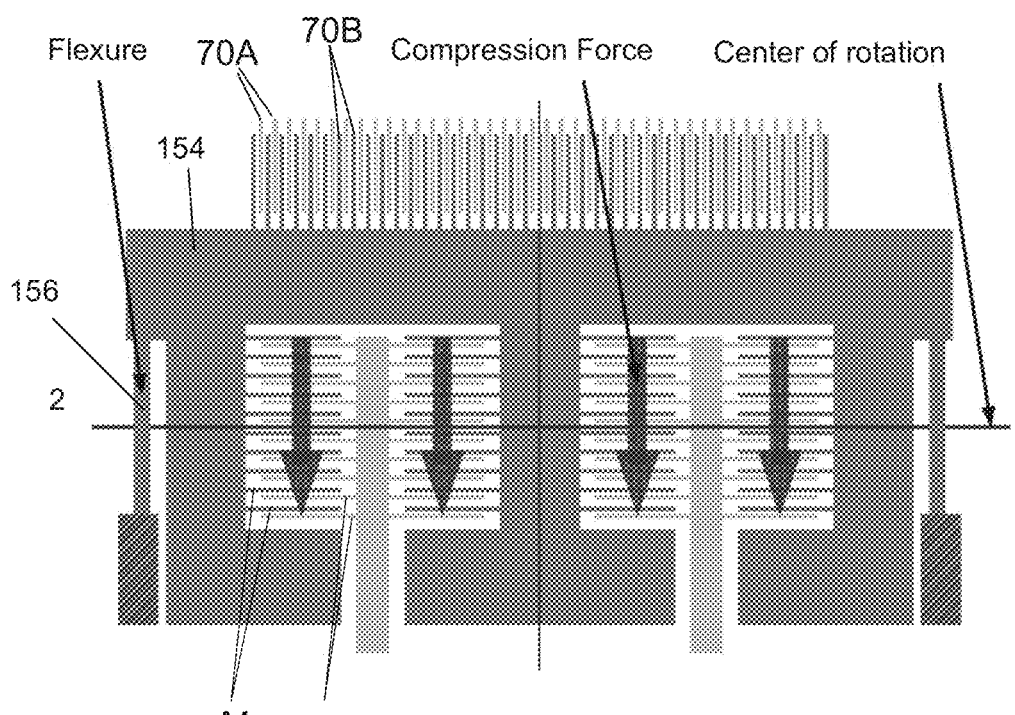
FIG. 17 illustrates a tilting device including bending beams in a suspension and employing the electrostatic actuation mechanism for actuation.
Figure 18:
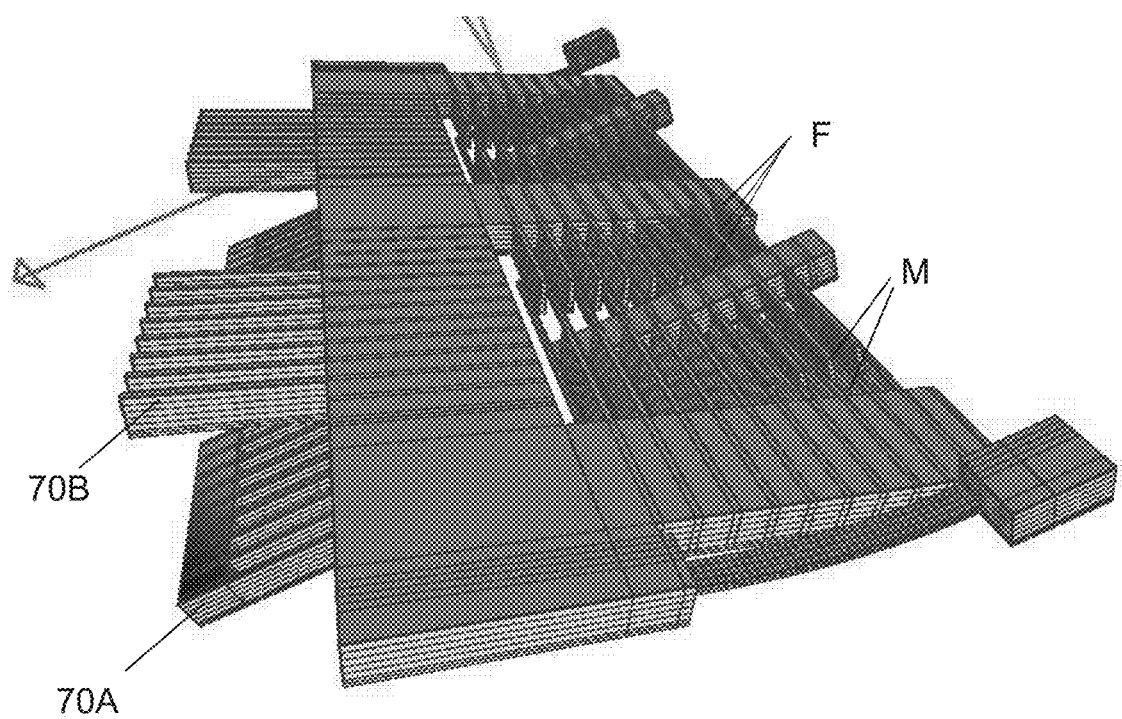
FIG. 18 gives a different view of the device of FIG. 17.

Referring to FIGS. 17 and 18, together, in the electrostatic tilting device that was studied by the inventors the axial force acting on the suspension flexure 156 was provided by an electrostatic transducer realized in the framework of a close-gap actuator (in some embodiments that is referred to as a comb-like close gap single layer actuator). In different embodiments, the axial force could be produced by another field, for example, magnetic.

The axial force providing the extension stress can be implemented either as a compression force or a tension force. As shown in FIG. 17 by arrows, a compression force is provided. In this figure, the movable electrodes (though not all of them) are denoted M, as in FIGS. 3A and 3B of this specification. The fixable electrodes are denoted F.

FIG. 18 shows a different view of the device shown in FIG. 17. As shown in FIGS. 17 and 18, another pair of movable and fixable interdigitated electrodes 70A and 70B, respectively, is provided. By applying a suitable voltage bias to this another pair of interdigitated electrodes 70A and 70B another compression force and/or tension force may also be provided that can, for example, be used for tuning the electrostatic tilting device and/or displacement sensing.

It should be reminded that the inventors' technique is not limited to cases with electrostatic actuation, the proposed tuning method can be implemented with any type of actuation (electrostatic, magnetic, piezoelectric, thermal etc.), mutatis mutandis.

In order to study the electromechanical behavior of the device and the functionality of the tuning mechanism, an electromechanical lumped model of the actuator was built. A suspension flexure in the shape of a cantilever beam with inextensible axis and bending stiffness EI was considered. The flexure was experiencing a torque M and a compression force P, applied at the free end of the cantilever with a length L. The deformed shape of the flexure w(x) experiencing the applied torque is shown in FIG. 16B, where $x_p$ is a distance from the clamped end of the beam to the virtual pivot. By solving the differential equation of the beam completed by the appropriate boundary conditions $$EIw^{IV}+Pw''=0$$

$$w(0)=0 \; w'(0)=0 \; EIw'''(L)=0 \; -EIw''(L)=M \quad (4)$$

the inventors obtained the location of the virtual pivot $x_p=L-w(L)/w'(L)$. Here ( )' denotes derivative with respect to the coordinate x. One can show that for the case of small angles $w' \ll 1$ and small forces $|P| \ll P_E$, where $P_E$ is the Euler buckling force of the cantilever, the location of the virtual pivot is approximated by the expression $$\frac{x_p}{L} = \frac{1}{2} \mp \frac{\pi^2}{96} \frac{P}{P_E} \quad (5)$$

where the signs "−" and "+" correspond to the compression and tension axial forces, respectively. Equation (5) implies that for small values of the axial force, compared to the Euler buckling force, the virtual pivot is located at the midspan point of the cantilever. However, for higher values of the axial force, the location of the virtual pivot along the flexure may vary up to 10 percents of the length of the suspension and is limited by the buckling value of the force ($P=P_E$). In the case of compressive axial force, the direction of the change in the location of the virtual pivot is towards the anchor. However, in the case of tensile axial force, the direction is away from the anchor.

The equivalent torsional stiffness of the suspension is calculated as a ratio between the applied torque and the slope at the end of the beam:

$$K = \frac{M}{w'(L)} \quad (6)$$

which, for the case of the compression force, takes the form $$K = \frac{\alpha}{\tan(\alpha)} K_0 \sim K_0 \left[ 1 - \frac{1}{3}\alpha^2 \right], \quad (\alpha \ll 1) \quad (7)$$

where $$K_0 = \frac{EI}{L} \quad (8)$$

$$\alpha = \frac{\pi}{2} \sqrt{\frac{P}{P_E}}$$

$$P_E = \frac{\pi^2 EI}{4L^2}$$

$$P = V^2 \psi$$

The inventors have observed that both the stiffness of the flexure (7) and the location of the virtual pivot (5) are functions of the axial force. Since or when this force is provided by the electrostatic transducer, the equivalent torsional stiffness K is a function of the voltage. Therefore, it is possible to tune the stiffness of the suspension by controlling the voltage. This important attribute is relevant for static (DC) as well as dynamic (AC) actuation.

It should be noted that since the resonant frequency ω of tilting devices exhibits square root dependence on suspension stiffness K and the mass moment of inertia $I_m$ such that $\omega = \sqrt{K/I_m}$ while the force provided by an electrostatic transducer typically manifests quadratic dependence on voltage, in accordance with equations (7) and (8), the shift in the resonant frequency is a linear function of voltage.

Figure 19:
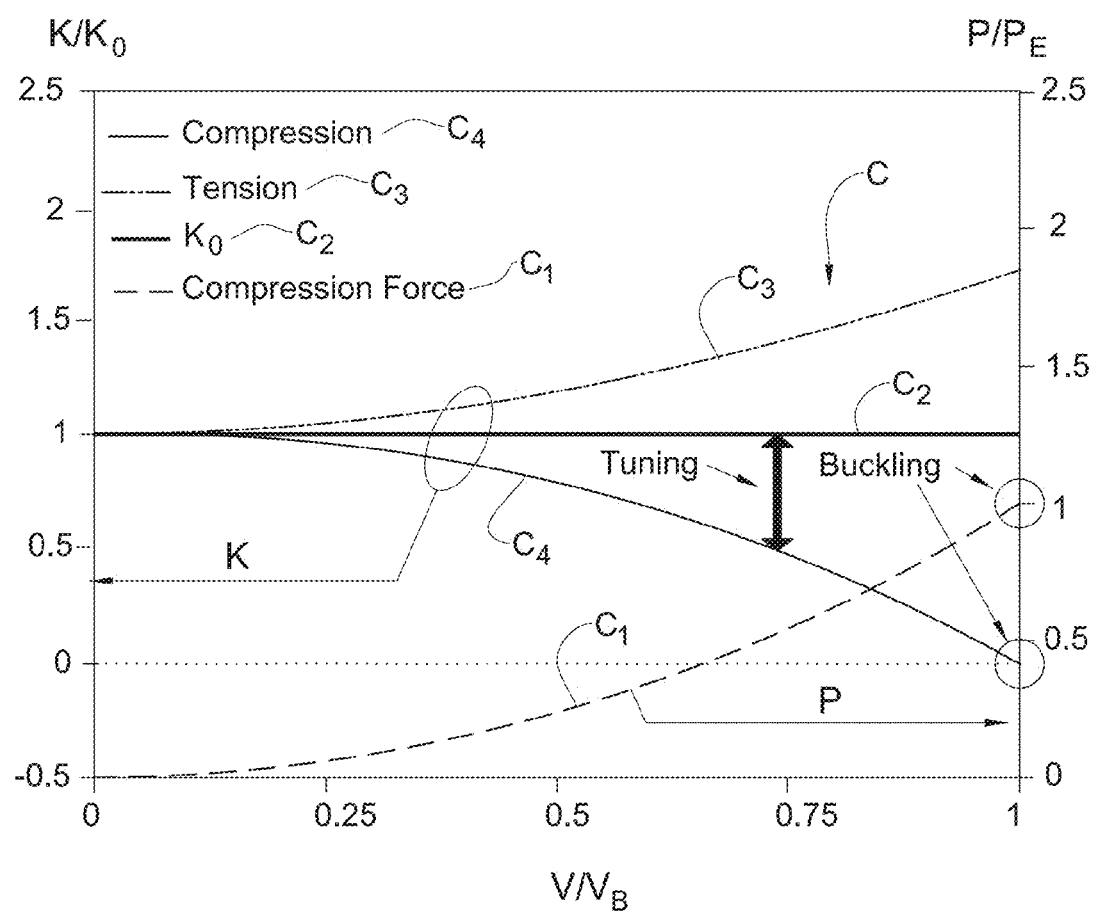
FIG. 19 shows dependencies of the bending stiffness on actuation voltage for various types of axial force.

FIG. 19 presents a comparison for various actuation voltages between the suspension stiffness of the flexures and the stiffness of the suspension without axial force applied to it (K=$K_0$, see equation (7)). One observes that the tuning is achievable in very large range. In the case of a compression force, the tuning is more efficient (larger ΔK/ΔP) and is limited by the buckling value of the force. One can conclude that the cantilever suspension for tilting actuators provides an ability to control the equivalent torsional stiffness and consequently the resonant frequency by controlling the applied voltage. In addition, by applying tension or compression force, the resonant frequency can be changed upward or downward respectively.

The axial force P applied to the suspension in the horizontal direction is provided by the parallel plate electrostatic transducer containing multiple electrodes, as shown in FIG. 17. The force per unit voltage, $\psi = P/V^2$ defined in equation (8) is calculated using the expression $$\psi = \frac{\varepsilon_0 N L_e h}{2 E I g^2} \quad (9)$$

Here $\varepsilon_0$ is the dielectric permittivity, N is the number of electrodes, g is the gap between the electrodes, $L_e$ and h are the length and height of each electrode, respectively. It should be noted that equation (9) refers to the initial, undeformed, position of the electrodes and consequently zero tilting angle. With increase of the tilting angles the electrostatic forces in the horizontal direction decreases while an additional restoring electrostatic torque associated with the "comb drive mode" of the actuator increases. The expressions for the components of the force do not need to be presented here explicitly as they can always be calculated in the design stage.

The devices again were fabricated by silicon on insulator (SOI) based technology, using a single structural layer. Repeating that written earlier, the fabrication of the offset suspension was accomplished by critically timed front side Deep Reactive Ion Etching (DRIE). Before the back side processing, the patterned front side of the wafer was protected using plasma enhanced chemical vapor deposition (PECVD) deposited silicon dioxide layer, providing a mechanical protection and preventing mechanical damage due to the presence of the highly stressed $SiO_2$ BOX layer. Moreover, the conformal PECVD layer serves as protection of the microstructure in the case of the damage of the BOX etch stop layer when the undesired etching of the device layer by the plasma penetrating through the openings in the stop layer occurs. Devices with three different types of suspensions were fabricated and characterized: an elastic torsion axis, suspension flexure under a tension load and suspension flexure under a compression load.

Figure 20:
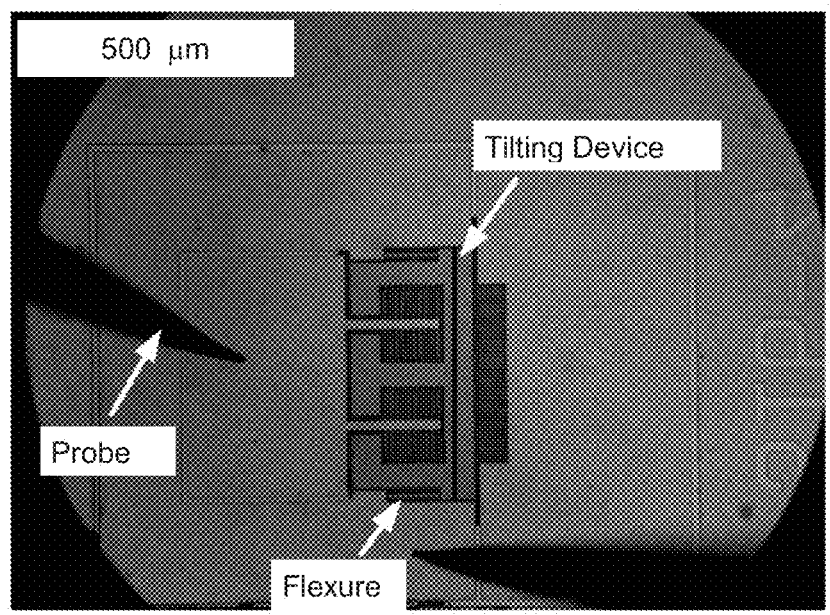
FIG. 20 is a SEM image of a device having a bending flexure suspension.
Figure 21:
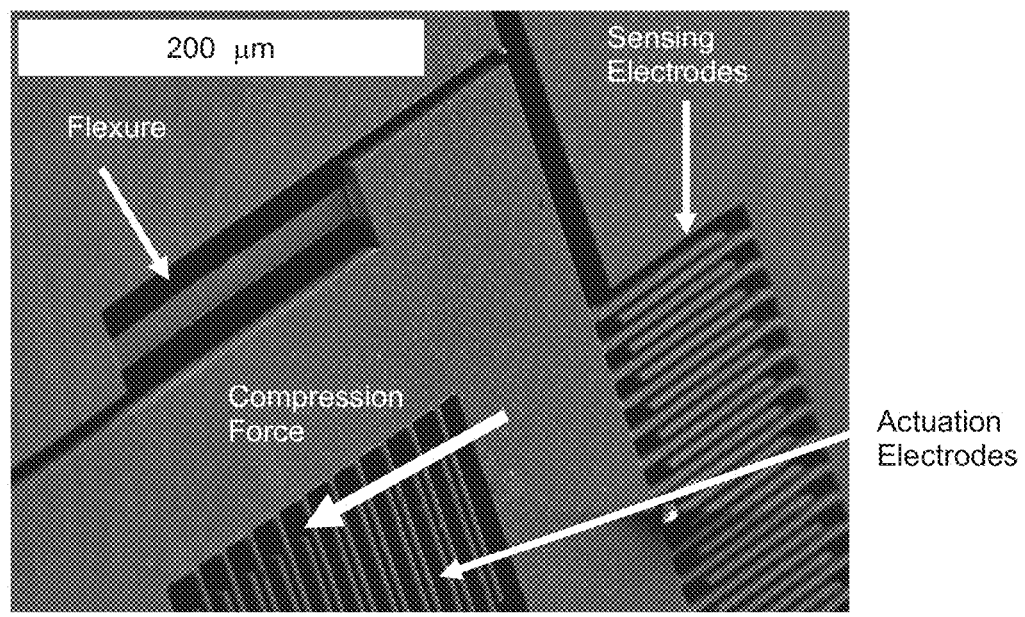
FIG. 21 is another SEM image of the device having the bending flexure suspension.
Figure 22:
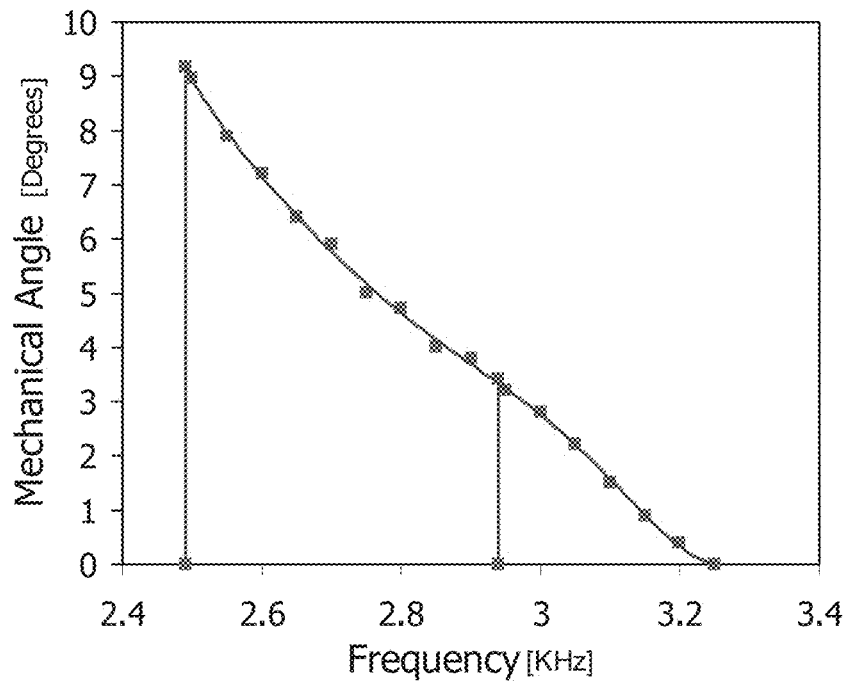
FIG. 22 shows art experimental resonant curve obtained for an actuator having bending beams in suspension.
Figure 23:
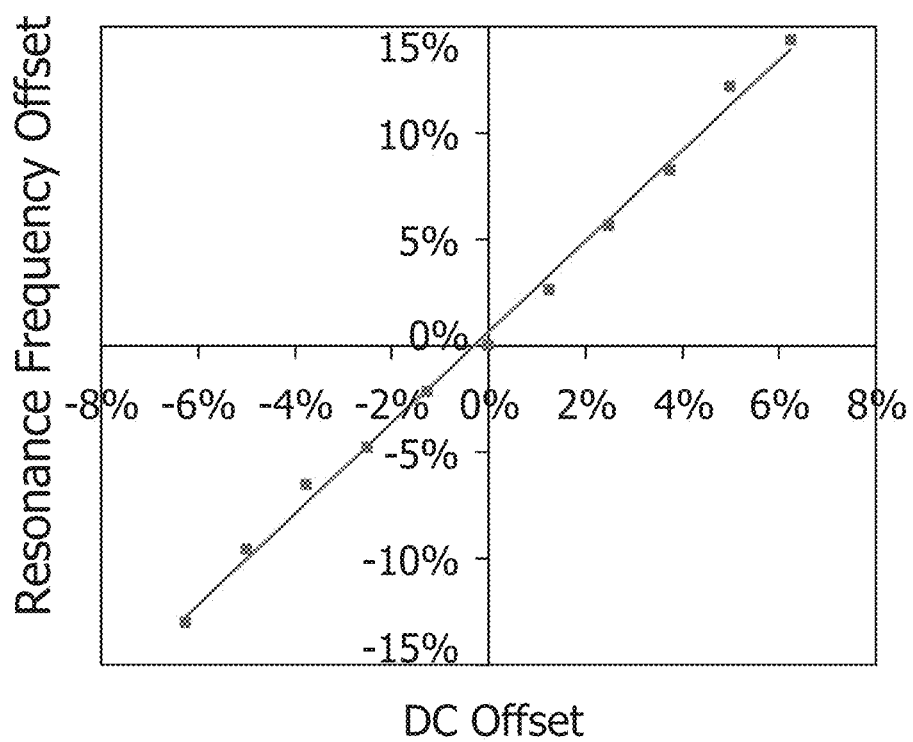
FIG. 23 shows an experimentally obtained linear tuning of resonant frequency by change of a dc component of the actuating voltage for an actuator having bending beams in suspension; for art actuating device having bending beams in suspension.

The characterization of the dynamic response was performed by reflecting a laser beam from the device surface and measuring the optical angle of a laser beam scanned by the tilting device; FIG. 20 shows an optical microscope image of the oscillating device. In order to actuate the device and to modify the axial force, the devices were operated by applying a sinusoidal voltage with the amplitude iv, and a steady offset voltage $V_{DC}$. The device with a suspension flexure under a compression load, which scanning electron micrograph is shown in FIG. 21, exhibits typical nonlinear parametric resonant behavior revealing itself in FIG. 22 (the figure shows an experimental resonant curve for $V_{DC}$=0, the response is typical for nonlinear parametrically excited oscillators). It was found that the relative change in the resonant frequency of the device with a suspension flexure under a compression load, relative to the device with no axial force applied, is a linear function of the $V_{DC}$ within a range close to 30 percents; the results are presented in FIG. 23. In these measurements, the DC offset voltage was between −10V to +10V and $V_{AC}$ 160V pk-pk. It should be noted that in the case of the device with an elastic torsion axis and consequently K=const, no dependence between $V_{DC}$ and resonant frequency was observed.

To the above it should be added that the realization of suspension by using bending flexures has reduced the risk for side pull-in. It also should be noted that the technique of the inventors allows actuation of a two axis mirror/gyro by one set of combs. Usually, in a device formed of two perpendicular axis and an external frame (gimbal), two sets of combs are necessary, each being perpendicular to its rotation axis. However in the design such as that shown in FIGS. 15 and 16A, two-axis mirrors can be actuated by one set of combs since the actuation is achieved, at least at resonance, by the combs parallel to the axis. The resonance frequencies are distinctly separated for two axis: for example one may be about 20 kHz and the other about 100 HZ); therefore in some embodiments it is possible to excite two-axis oscillations by applying a lower frequency voltage and a higher frequency voltage together.

Those skilled in the art will readily appreciate that various modifications and changes can be applied to the embodiments of the invention as hereinbefore described without departing from its scope defined in and by the appended claims.

The invention claimed is:

1. A tunable tilting device comprising:
    a tilting element and a suspension structure including at least one flexure coupled to the tilting element, said suspension structure having a variable bending stiffness and configured to bend due to a tilting motion of the tilting element around a pivot axis, said suspension structure being responsive to a tuning force actuating a variation of an extension stress or a compression stress of the suspension structure, whereby the bending stiffness of the suspension structure is varied as a result of the response to the tuning force.

2. The tilting device of claim 1, wherein said tuning force is produced by an actuation selected from the list including an electrostatic actuation, a magnetic actuation, a piezoelectric actuation and a thermal actuation.

3. The tilting device of claim 1, wherein said pivot axis passes through a pivot point having a location substantially independent of deflection of the suspension structure from equilibrium position.

4. The tilting device of claim 1, comprising a tilting actuator comprising a fixable electrode structure (F) comprising mutually parallel fixable electrodes and a movable electrode structure (M) comprising mutually parallel movable electrodes coupled to the tilting element, the fixable electrodes of said fixable electrode structure are at least partially interdigitated with the movable electrodes of said movable electrode structure to form overlaps; said tilting actuator being configured for tilting the movable electrode structure with respect to the fixable electrode structure about said pivot axis, wherein said pivot axis is substantially parallel to planes of the electrodes of the fixable electrode structure and to planes of the electrodes of the movable electrode structure.

5. The tilting device of claim 4, wherein said pivot axis is positioned so that the tilting changes angles and distances between the fixable electrodes of the fixable structure and the movable electrodes of the movable structure within the overlaps.

6. The tilting device of claim 4, wherein said pivot axis is positioned so that the tilting changes dimensions of the overlaps and dimensions of the gaps between the fixable and movable electrodes in regions where the electrodes are interdigitated.

7. The tilting device of claim 4, wherein said tuning force is provided by applying a voltage bias to the interdigitated fixable and movable electrodes to cause a change of an extension or compression stress of the suspension structure.

8. The tilting device of claim 4, further comprising another pair of interdigitated fixable electrodes (70A) and movable electrodes (70B).

9. The tilting device of claim 8, wherein said tuning force is provided by applying a voltage bias to said another pair of interdigitated fixable and movable electrodes.

10. The tunable tilting device of claim 8, wherein said interdigitated fixable and movable electrodes and said another pair of interdigitated fixable and movable electrodes have a common material layer.

11. The tunable tilting device of claim 1 fabricated as a MEMS device.

12. The tunable tilting device of claim 1, comprising a mirror carried by the tilting element.

13. The tunable tilting device of claim 1, comprising an excitation unit configured to excite the device at a parametric resonance frequency.

\* \* \* \* \*